(12) United States Patent
Kim et al.

(10) Patent No.: US 12,133,425 B2
(45) Date of Patent: Oct. 29, 2024

(54) DISPLAY DEVICE

(71) Applicant: Samsung Display Co., Ltd., Yongin-Si (KR)

(72) Inventors: Eung Taek Kim, Hwaseong-si (KR); Kohei Ebisuno, Hwaseong-si (KR); Suk Hoon Ku, Seoul (KR); Jin Suk Lee, Gwangmyeong-si (KR); Jung Mi Choi, Seoul (KR); Young In Hwang, Suwon-si (KR); Tae Sik Kim, Hanam-si (KR); Jin Suk Seo, Cheonan-si (KR); Hwang Sup Shin, Cheonan-si (KR); Taek Geun Lee, Seongnam-si (KR); Joo Hyeon Jo, Cheonan-si (KR); Hong Jun Choi, Seoul (KR); Hee Yeon Kim, Hwaseong-si (KR); Na Lae Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 573 days.

(21) Appl. No.: 17/398,742

(22) Filed: Aug. 10, 2021

(65) Prior Publication Data

US 2022/0140033 A1 May 5, 2022

(30) Foreign Application Priority Data

Nov. 2, 2020 (KR) .................. 10-2020-0144420

(51) Int. Cl.
*G09G 3/00* (2006.01)
*H01L 29/792* (2006.01)
*H10K 59/123* (2023.01)
*H10K 59/124* (2023.01)
*H10K 59/131* (2023.01)
*G09G 3/3208* (2016.01)

(52) U.S. Cl.
CPC ........ *H10K 59/124* (2023.02); *H01L 29/792* (2013.01); *H10K 59/123* (2023.02); *H10K 59/131* (2023.02); *G09G 3/3208* (2013.01)

(58) Field of Classification Search
CPC ............. G09G 3/3208; H01L 27/1225; H01L 29/4234; H01L 29/792; H10K 59/123; H10K 59/124; H10K 59/131
See application file for complete search history.

(56) References Cited

U.S. PATENT DOCUMENTS

2013/0178031 A1* 7/2013 Ramkumar ............ H10B 43/40
257/E21.423
2019/0296029 A1* 9/2019 Banno ............... H01L 21/02274

FOREIGN PATENT DOCUMENTS

KR      10-1302619 B1      9/2013
KR   10-2016-0104790 A    9/2016
(Continued)

*Primary Examiner* — Insa Sadio
(74) *Attorney, Agent, or Firm* — Innovation Counsel LLP

(57) ABSTRACT

A display device is provided. The display device includes a first substrate, a first charge trap layer disposed on the first substrate and including silicon nitride, a semiconductor layer disposed on the first charge trap layer and including a first active layer of a first transistor and a second active layer of a second transistor, and an organic light emitting element electrically connected to the first transistor, wherein a ratio of a content of a Si element to a content of an N element in the first charge trap layer is in a range of 1.6 to 2.5.

19 Claims, 15 Drawing Sheets

(56) References Cited

FOREIGN PATENT DOCUMENTS

| KR | 10-1854497 | B1 | 6/2018 |
|----|------------|----|--------|
| KR | 10-2019-0062672 | A | 6/2019 |

* cited by examiner

DISPLAY DEVICE

This application claims priority from Korean Patent Application No. 10-2020-0144420 filed on Nov. 2, 2020 in the Korean Intellectual Property Office, and all the benefits accruing therefrom under 35 U.S.C. 119, the contents of which in its entirety are herein incorporated by reference.

BACKGROUND

1. Field

The present disclosure relates to a display device.

2. Description of the Related Art

A display device for displaying an image is used for various electronic appliances for providing an image to a user, such as smart phones, tablet PCs, digital cameras, notebook computers, navigators, and televisions.

The display device may be a flat panel display device such as a liquid crystal display device, a field emission display device, or an organic light emitting display device. Since an organic light emitting display device, among flat panel display devices, includes light emitting elements by which each of the pixels in a display panel emits light by itself, it may display an image without a backlight unit providing light to the display panel.

SUMMARY

Aspects of the inventive concept are to provide a display device having improved element characteristics of semiconductor elements for driving a light emitting element.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

An embodiment of a display device includes a first substrate, a first charge trap layer disposed on the first substrate and including silicon nitride, a semiconductor layer disposed on the first charge trap layer and including a first active layer of a first transistor and a second active layer of a second transistor, and an organic light emitting element electrically connected to the first transistor, wherein a ratio of a content of a Si element to a content of an N element in the first charge trap layer is in a range of 1.6 to 2.5.

An embodiment of a display device includes a first substrate, a first charge trap layer disposed on the first substrate and including silicon nitride, a second substrate disposed on the first substrate with the first charge trap layer between the first substrate and the second substrate, a second charge trap layer disposed on the second substrate and including silicon oxide, a semiconductor layer disposed on the second charge trap layer and including a first active layer of a first transistor and a second active layer of a second transistor, and an organic light emitting element electrically connected to the first transistor, wherein a ratio of N—H bonds in the second charge trap layer is in a range of 0.7 at % to 1.5 at %.

An embodiment of a display device includes a first substrate, a first charge trap layer disposed on the first substrate and including silicon nitride, a semiconductor layer disposed on the first charge trap layer and including a first active layer of a first transistor and a second active layer of a second transistor, and an organic light emitting element electrically connected to the first transistor, wherein a content of a Si element in the first charge trap layer is in a range of 60 at % to 70 at %, and a content of an N element in the first charge trap layer is in a range of 25 at % to 35 at %.

According to a display device according to an embodiment, elements characteristics of semiconductor elements for driving a light emitting element may be improved.

BRIEF DESCRIPTION OF THE DRAWINGS

The above and other aspects and features of the inventive concept will become more apparent by describing in detail embodiments with reference to the attached drawings.

DETAILED DESCRIPTION OF THE EMBODIMENTS

The inventive concept will now be described more fully hereinafter with reference to the accompanying drawings, in which embodiments are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments will be described with reference to the attached drawings.

Figure 1:
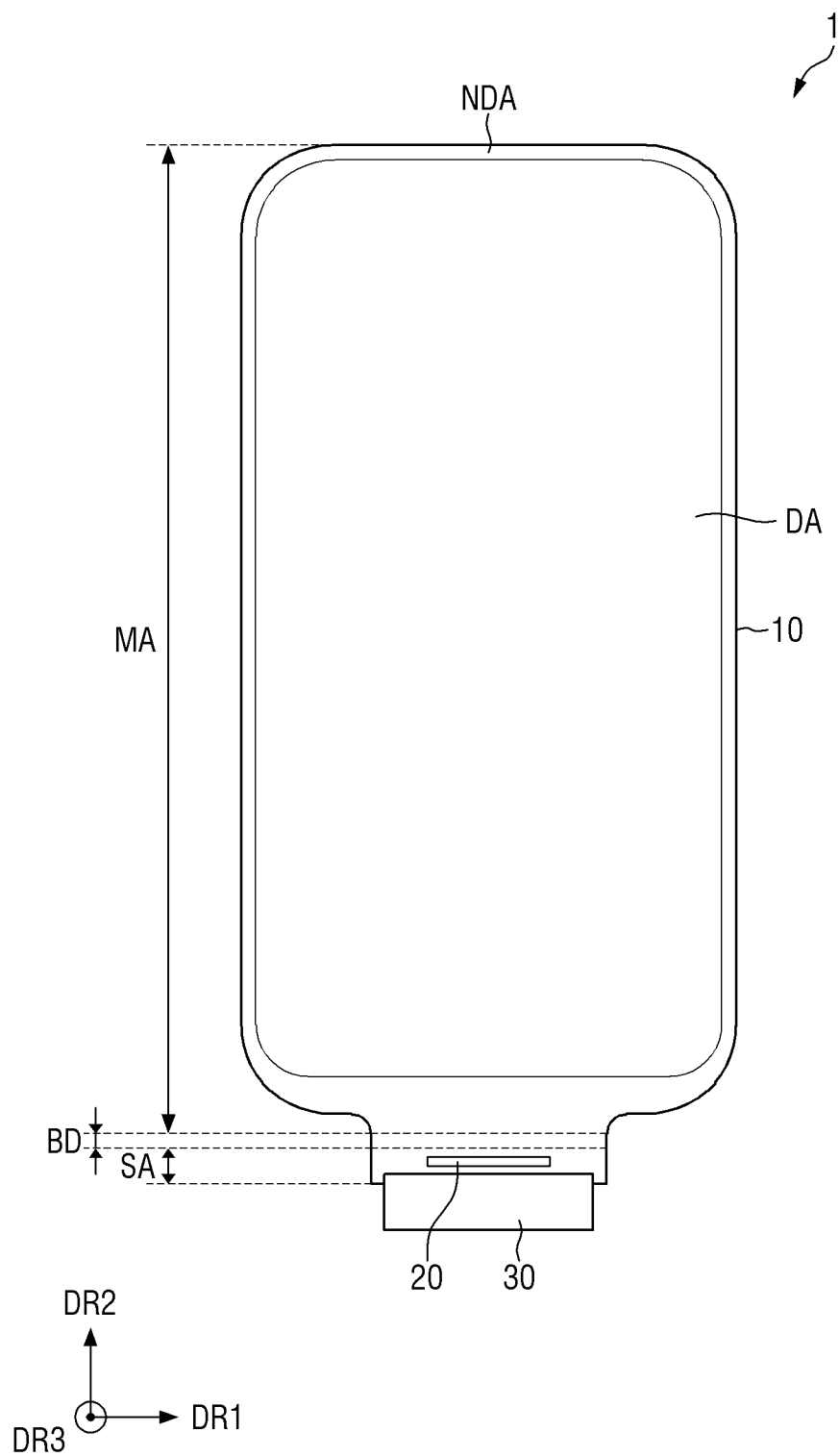
FIG. 1 is a plan view of a display device according to an embodiment.
Figure 2:
FIG. 2 is a side view of the display device of FIG. 1 and illustrates a side shape of the display device in a state where it is bent in a thickness direction.
Figure 2:
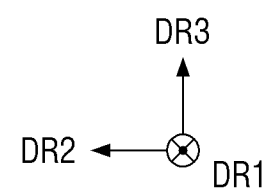

FIG. 1 is a plan view of a display device 1 according to an embodiment. FIG. 2 is a side view of the display device 1 of FIG. 1. FIG. 2 illustrates a side shape of the display device 1 in a state where it is bent in a thickness direction.

The display device 1, which is a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra-mobile PCs (UMPCs).

The display device 1 according to an embodiment may be formed in a substantially rectangular shape in a plan view. The display device 1 may have a rectangular shape with vertical corners in a plan view. However, the display device 1 may have a rectangular shape with rounded corners in a plan view.

In the drawings, the first direction DR1 indicates a horizontal direction of the display device 1 in a plan view, and the second direction DR2 indicates a vertical direction of the display device 1 in a plan view. The third direction DR3 indicates a thickness direction of the display device 1. The first direction DR1 and the second direction DR2 intersect each other in a direction perpendicular to each other. The third direction DR3 intersects both the first direction DR1 and the second direction DR2 in a direction intersecting the plane in which the first direction DR1 and the second direction DR2 lie. However, the directions mentioned in embodiments should be understood as mentioning relative directions.

Unless otherwise defined, as used herein, "upper portion", "upper surface", and "upper side" expressed based on the third direction DR3 mean a side of a display surface based on a display panel 10, and "lower portion", "lower surface", and "lower side" expressed based on the third direction DR3 mean an opposite side of a display surface based on the display panel 10.

Referring to FIGS. 1 and 2, the display device 1 may include the display panel 10. The display panel 10 may be a flexible substrate including a flexible polymer material such as polyimide. Accordingly, the display panel 10 may be warped, bent, folded, or rolled.

The display panel 10 may be an organic light emitting display panel. In the following embodiments, a case where an organic light emitting display panel is applied as the display panel 10 is illustrated, but different kinds of display panels such as a liquid crystal display (LCD) panel, a quantum dot organic light emitting display (QD-OLED) panel, a quantum dot liquid crystal display (QD-LCD) panel, a quantum nano light emitting display panel (nano NED), and a micro light emitting diode (LED) may be applied.

The display panel 10 may include a display area DA in which an image is displayed, and a non-display area NDA in which an image is not displayed. The display panel 10 may be divided into the display area DA and the non-display area NDA in a plan view. The non-display area NDA may be disposed to surround the display area DA. The non-display area NDA may constitute a bezel.

The display area DA may have a rectangular shape with vertical corners or a rectangular shape with rounded corners. However, the planar shape of the display area DA may have a circular shape, an elliptical shape, or other various shapes.

The display area DA may include a plurality of pixels. The pixels may be arranged in a matrix shape. Each pixel may include a light emitting layer and a circuit layer that controls the amount of light emitted from the light emitting layer. The circuit layer may include lines, electrodes, and at least one transistor. The light emitting layer may include an organic light emitting material. The light emitting layer may be sealed by an encapsulation layer. A detailed configuration of the pixel will be described later.

The non-display area NDA may surround all the sides of the display area DA, and may form a frame of the display area DA.

The display panel 10 may include a main area MA and a bending area BD connected to one side of the main area MA in the second direction DR2. The display panel 10 may further include a sub-area SA connected to one side of the bending area BD in the second direction DR2 and bent in a thickness direction to overlap the main area MA in the thickness direction.

The display area DA may be located in the main area MA. The non-display area NDA may be located at a peripheral edge portion of the display area DA of the main area MA.

The main area MA may have a shape similar to the planar appearance of the display device 1. The main area MA may be a flat area located on one plane. However, in the main area MA, at least one of the edges other than the edge, sometimes called side, connected to the bending area BD may be bent to form a curved surface or may be bent in a vertical direction.

In the main area MA, when at least one of the edges other than the edge (side) connected to the bending area BD is bent to form a curved surface or is bent in a vertical direction, the display area DA may also be disposed at the corresponding edge. However, the non-display area NDA not displaying an image may be disposed at the curved surface or the bent edge, or both the display area DA and the non-display area NDA may be at the curved surface or the bent edge.

The non-display area NDA of the main area MA may be placed in an area from the outer boundary of the display area DA to the edge of the display panel 10. In the non-display area NDA of the main area MA, signal lines or driving circuits for applying signals to the display area DA may be arranged.

The bending area BD may be connected through one short side of the main area MA. The width of the bending area BD in the first direction DR1 may be smaller than the width of the main area MA (width of the short side of the main area MA in the first direction DR1). The connection portion between the main area MA and the bending area BD may have an L-shaped cut shape to reduce the width of a bezel.

In the bending area BD, the display panel 10 may be bent with a curvature in a direction opposite to the display surface. As the display panel 10 is bent in the bending area BD, the surface of the display panel 10 may be reversed. That is, one surface of the display panel 10 facing upward may be changed so as to face the outer side of the side surface and then face the lower side of the display panel 10 again through the bending area BD.

The sub-area SA extends from the bending area BD. The sub-area SA may extend in a direction parallel to the main area MA from the start after the completion of bending. The sub-area SA may overlap the main area MA in the thickness direction DR3 of the display panel 10. The sub-area SA may overlap the non-display area NDA at the edge of the main area MA, and may overlap the display area DA of the main area MA. The width of the sub-area SA may be the same as the width of the bending area BD.

A pad portion (not shown) may be disposed on the sub-area SA of the display panel 10. An external device may be mounted (or attached) onto the pad portion. Examples of the external device may include a driving chip 20 and a driving substrate 30 such as a flexible printed circuit board or a rigid printed circuit board. In addition, a line connection film, a connector, and the like may be mounted on the pad portion as external devices. One external device may be mounted on the sub-area SA, but a plurality of external devices may also be mounted on the sub-area SA. For example, as shown FIGS. 1 and 2, the driving chip 20 may be disposed in the sub-area SA of the display panel 10, and the driving substrate 30 may be attached to the end of the sub-area SA. In this case, the display panel 10 may include both a pad portion connected to the driving chip 20 and a pad portion connected to the driving substrate 30. As another example, the driving chip 20 may be mounted on a film, and the film may be attached to the sub-area SA of the display panel 10.

The driving chip 20 is mounted on one surface of the display panel 10, the one surface being the same as a display surface. However, as described above, as the bending area BD is bent to be reversed, the driving chip 20 may be mounted on a surface of display panel 10 facing downward, and thus the upper surface of the driving chip 20 may face downward.

The driving chip 20 may be attached onto the display panel 10 through an anisotropic conductive film, or may be attached onto the display panel 10 through ultrasonic bonding. The driving chip 20 may include an integrated circuit that drives the display panel 10.

Figure 3:
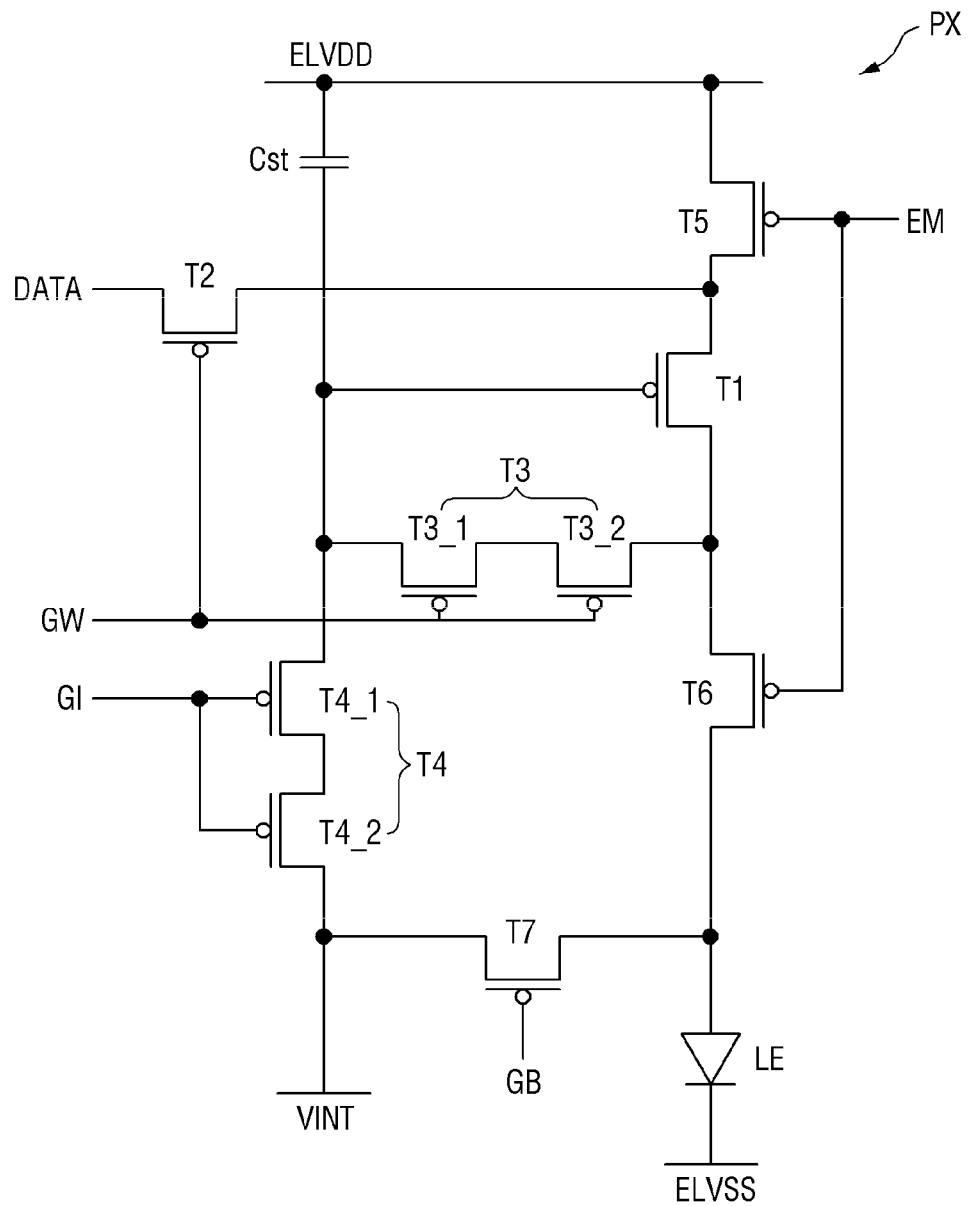
FIG. 3 is a circuit diagram specifically illustrating one pixel according to an embodiment.

FIG. 3 is a circuit diagram specifically illustrating one pixel PX according to an embodiment.

Referring to FIG. 3, the circuit of the pixel PX includes a plurality of transistors T1 to T7, a capacitor Cst, and a light emitting element LE. A data signal DATA, a first scan signal GW, a second scan signal GI, a third scan signal GB, a light emission control signal EM, a first power voltage ELVDD, a second power voltage ELVSS, and an initialization voltage VINT are applied to the circuit of the pixel PX.

Figure 7:
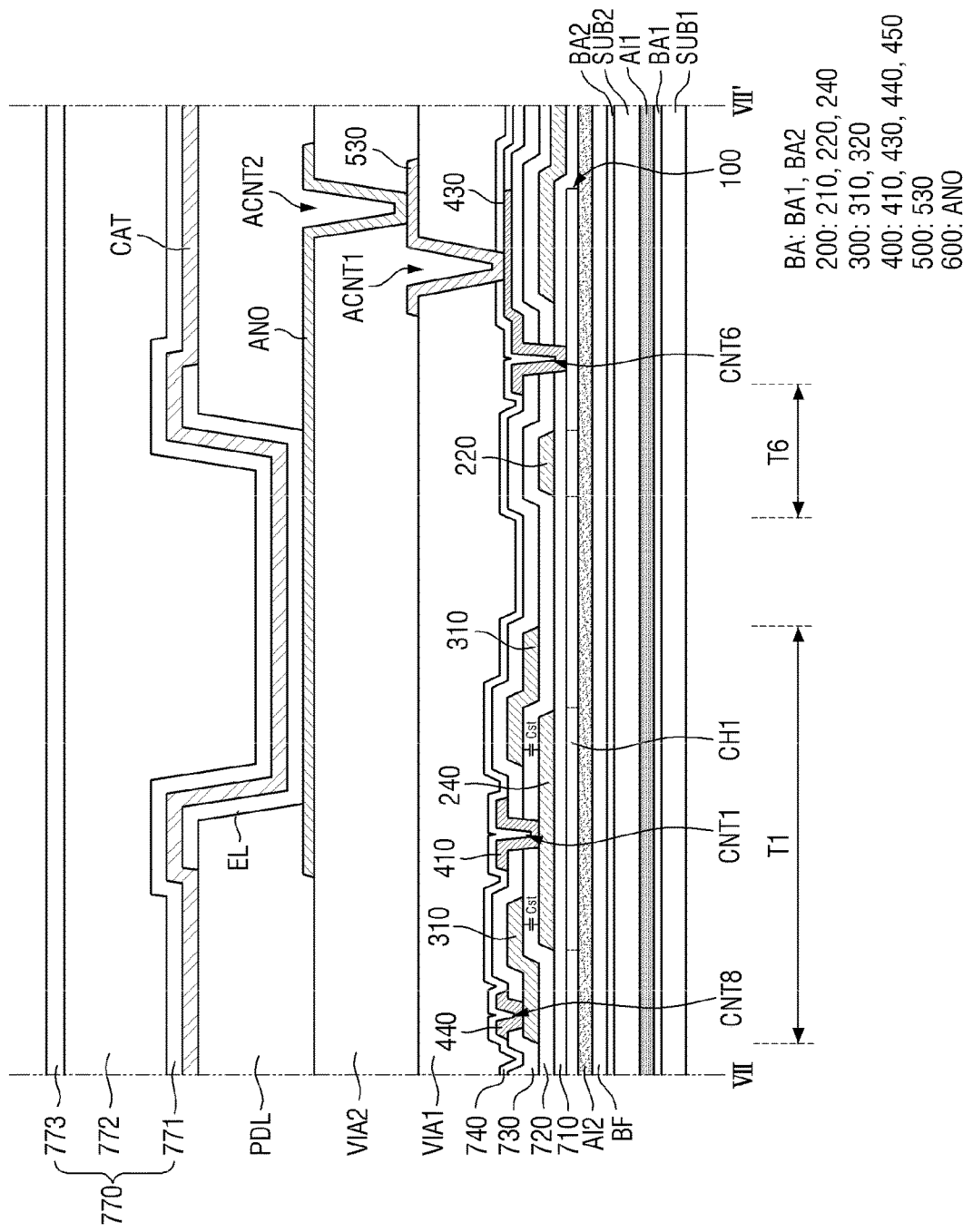
FIG. 7 is a cross-sectional view taken along the line VII-VII' in FIG. 4.

The light emitting element LE may be, for example, an organic light emitting diode including a first electrode (or anode electrode, refer to 'ANO' in FIG. 7), a light emitting layer (refer to 'EL' in FIG. 7), and a second electrode (or cathode electrode, refer to 'CAT' in FIG. 7).

The plurality of transistors may include first to seventh transistors T1 to T7. Each of the transistors T1 to T7 includes a gate electrode, a first electrode, and a second electrode. Any one of the first electrode and second electrode of each of the transistors T1 to T7 is a source electrode, and the other one of the first electrode and second electrode of each of the transistors T1 to T7 is a drain electrode.

The first transistor T1 may function as a driving transistor, and the second to seventh transistors T2 to T7 may function as switching transistors.

Each of the transistors T1 to T7 may be a thin film transistor. Each of the transistors T1 to T7 may be one of a PMOS transistor and an NMOS transistor. In an embodiment, the first transistor T1 as a driving transistor, the second transistor T2 as a data transfer transistor, the third transistor T3 as a compensation transistor, the fourth transistor T4 as a first initialization transistor, the fifth transistor T5 as a first light emission control transistor, the sixth transistor T6 as a second light emission control transistor, and the seventh transistor T7 as a second initialization transistor, are all PMOS transistors.

However, for example, the third transistor T3 as a compensation transistor and the fourth transistor T4 as a first initialization transistor are NMOS transistors, and the first transistor T1 as a driving transistor, the second transistor T2 as a data transfer transistor, the fifth transistor T5 as a first light emission control transistor, the sixth transistor T6 as a second light emission control transistor, and the seventh transistor T7 as a second initialization transistor may be PMOS transistors.

In this case, the active layers of the third transistor T3 and the fourth transistor T4 may include different materials from the active layers of the first transistor T1, the second transistor T2, the fifth transistor T5, the sixth transistor T6, and the seventh transistor T7. For example, the active layers of the third transistor T3 and the fourth transistor T4 may include an oxide semiconductor, and the active layers of the first transistor T1, the second transistor T2, the fifth transistor T5, the sixth transistor T6, and the seventh transistor T7 may include polycrystalline silicon.

Hereinafter, each configuration will be described in detail.

The gate electrode of the first transistor T1 is connected to the first electrode of the capacitor Cst. The first electrode of the first transistor T1 is connected to a first power voltage ELVDD terminal through the fifth transistor T5. The second electrode of the first transistor T1 is connected to the anode electrode of the light emitting element LE through the sixth transistor T6. The first transistor T1 receives a data signal DATA according to the switching operation of the second transistor T2 and supplies a driving current to the light emitting element LE.

The gate electrode of the second transistor T2 is connected to a first scan signal GW terminal. The first electrode of the second transistor T2 is connected to a data signal DATA terminal. The second electrode of the second transistor T2 is connected to the first electrode of the first transistor T1 and is connected to the first power voltage ELVDD terminal through the fifth transistor T5. The second transistor T2 is turned on according to the first scan signal GW to perform a switching operation of transmitting the data signal DATA to the first electrode of the first transistor T1.

The third transistor T3 may be formed as a dual transistor including a first sub-transistor T3_1 and a second sub-transistor T3_2. The gate electrode of the first sub-transistor T3_1 may be connected to the first scan signal GW terminal, the first electrode of the first sub-transistor T3_1 may be connected to the second electrode of the second sub-transistor T3_2, and the second electrode of the first sub-transistor T3_1 may be connected to the first electrode of the capacitor Cst, the first electrode of a third sub-transistor T4_1, and the gate electrode of the first transistor T1. The gate electrode of the second sub-transistor T3_2 may be connected to the first scan signal GW terminal, the first electrode of the second sub-transistor T3_2 may be connected to the second electrode of the first transistor T1, and the second electrode of the second sub-transistor T3_2 may be connected to the first electrode of the first sub-transistor T3_1.

The first sub-transistor T3_1 and the second sub-transistor T3_2 are turned on by the first scan signal GW to connect the gate electrode and second electrode of the first transistor T1 to connect the first transistor T1 as a diode. Accordingly, a voltage difference may occur between the first electrode and gate electrode of the first transistor T1 by the threshold voltage of the first transistor T1, and the threshold voltage-compensated data signal DATA may be supplied to the first transistor T1, thus compensating for a threshold voltage deviation of the first transistor T1.

The fourth transistor T4 may be formed as a dual transistor including the third sub-transistor T4_1 and a fourth sub-transistor T4_2. The gate electrode of the third sub-transistor T4_1 may be connected to the second scan signal GI terminal, the first electrode of the third sub-transistor T4_1 may be connected to the first electrode of the capacitor Cst, the second electrode of the first sub-transistor T3_1, and the gate electrode of the first transistor T1, and the second electrode of the third sub-transistor T4_1 may be connected to the first electrode of the fourth sub-transistor T4_2. The gate electrode of the fourth sub-transistor T4_2 may be connected to the second scan signal GI terminal, the first electrode of the fourth sub-transistor T4_2 may be connected to the second electrode of the third sub-transistor T4_1, and the second electrode of the fourth sub-transistor T4_2 may be connected to the initialization voltage VINT terminal. The third sub-transistor T4_1 and the fourth sub-transistor T4_2 are turned on by the second scan signal GI to transmit the initialization voltage VINT to the gate electrode of the first transistor T1 to perform an operation of initializing the voltage of the gate electrode of the first transistor T1.

The gate electrode of the fifth transistor T5 is connected to a light emission control signal EM terminal, the first electrode of the fifth transistor T5 is connected to a first driving voltage line ELVDD, and the second electrode of the fifth transistor T5 is connected to the first electrode of the first transistor T1. The fifth transistor T5 is turned on by the light emission control signal EM to connect the first electrode of the first transistor T1 and the first driving voltage line ELVDD.

The sixth transistor T6 is connected between the second electrode of the first transistor T1 and the first electrode of the light emitting element LE. The gate electrode of the sixth transistor T6 is connected to the light emission control signal EM terminal, the first electrode of the sixth transistor T6 is connected to the second electrode of the first transistor T1 and the first electrode of the second sub-transistor T3_2, and the second electrode of the sixth transistor T6 is connected to the first electrode of the light emitting element LE.

The fifth transistor T5 and the sixth transistor T6 are simultaneously turned on according to the light emission control signal EM, and accordingly, a driving current flows through the light emitting element LE.

The gate electrode of the seventh transistor T7 is connected to a third scan signal GB terminal. The first electrode of the seventh transistor T7 is connected to the anode electrode of the light emitting element LE. The second electrode of the seventh transistor T7 is connected to the initialization voltage VINT terminal. The seventh transistor T7 is turned on according to the third scan signal GB to initialize the anode electrode of an organic light emitting diode OLED.

Although it is exemplified in the present embodiment that the gate electrode of the seventh transistor T7 receives the third scan signal GB, in an embodiment, the circuit of the pixel PX may be configured such that the gate electrode of the seventh transistor T7 receives the light emission control signal EM or the second scan signal GI.

The capacitor Cst is formed between the gate electrode of the first transistor T1 and the first driving voltage line ELVDD, and includes a first electrode and a second electrode. The first electrode of the capacitor Cst may be connected to the gate electrode of the first transistor T1, the second electrode of the third transistor T3, and the first electrode of the fourth transistor T4. The second electrode of the capacitor Cst may be connected to the first driving voltage line ELVDD. The capacitor Cst may serve to constantly maintain a data voltage applied to the gate electrode of the first transistor T1.

The cathode electrode of the light emitting element LE is connected to a second power voltage ELVSS terminal. The light emitting element LE displays an image by receiving a driving current from the first transistor T1 and emitting light.

Hereinafter, the planar and cross-sectional structure of the aforementioned pixel PX will be described in detail.

Figure 4:
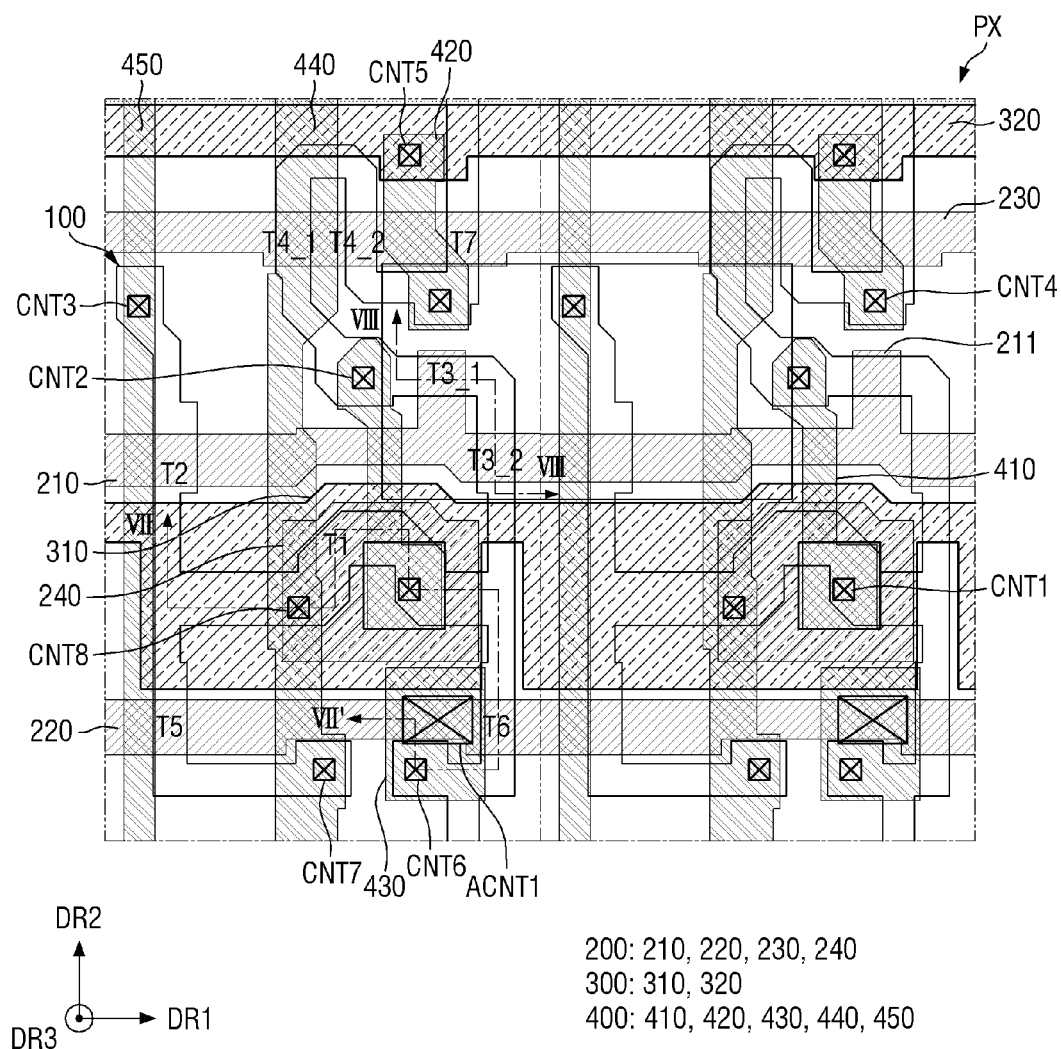
FIG. 4 is a layout view of one pixel of a display device according to an embodiment.
Figure 5:
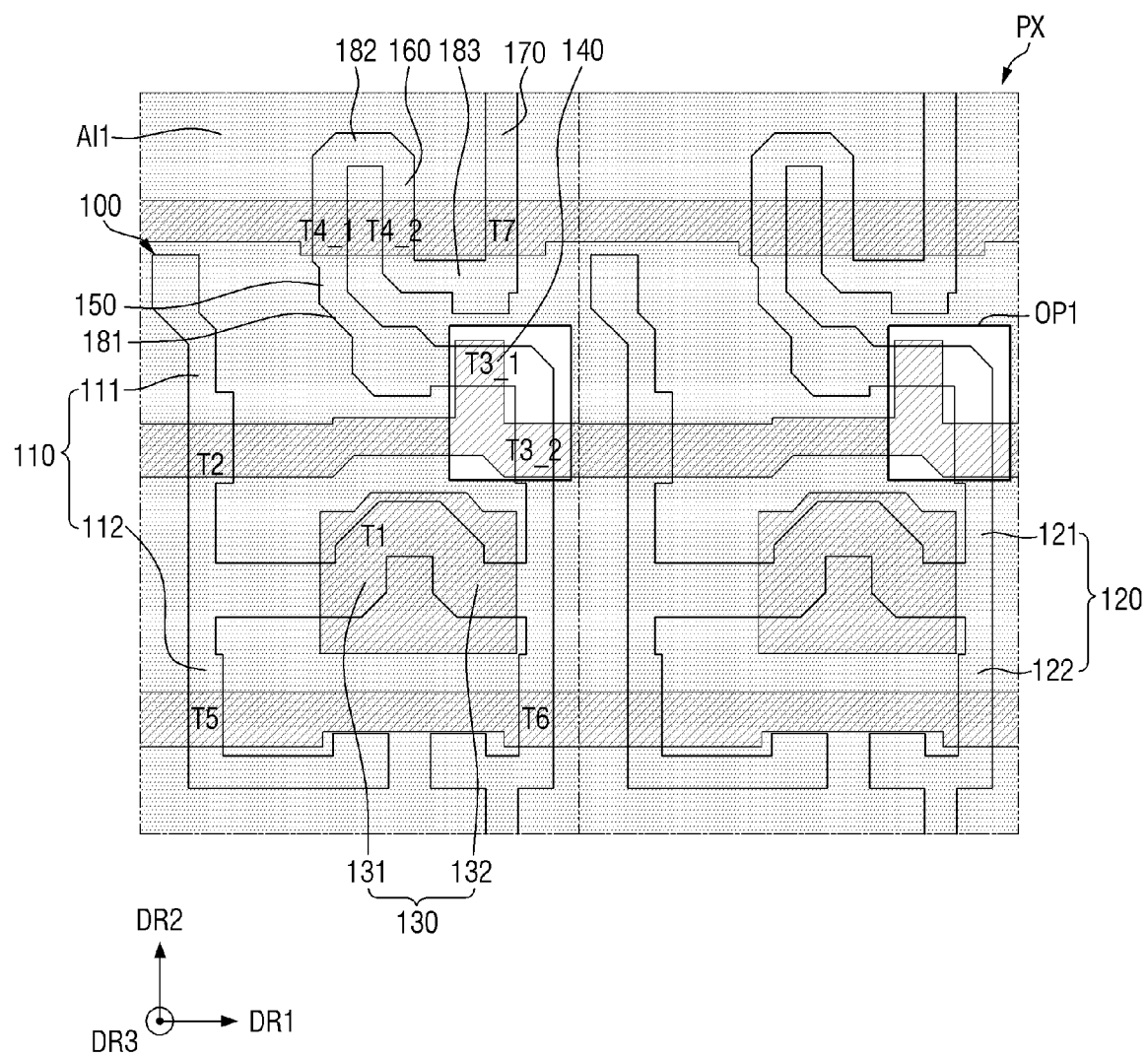
FIG. 5 is a layout view of a first charge trap layer, a semiconductor layer, and a first conductive layer.
Figure 6:
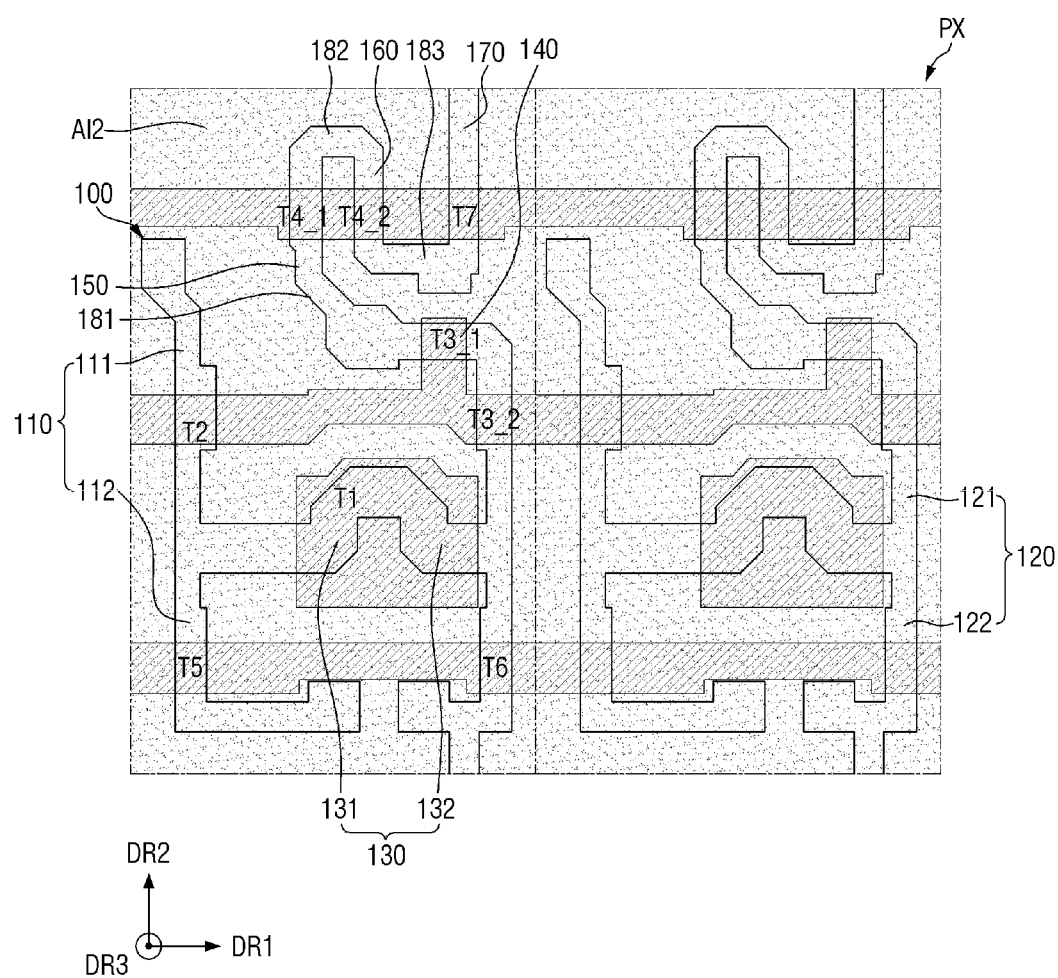
FIG. 6 is a layout view of a second charge trap layer, a semiconductor layer, and a first conductive layer.
Figure 8:
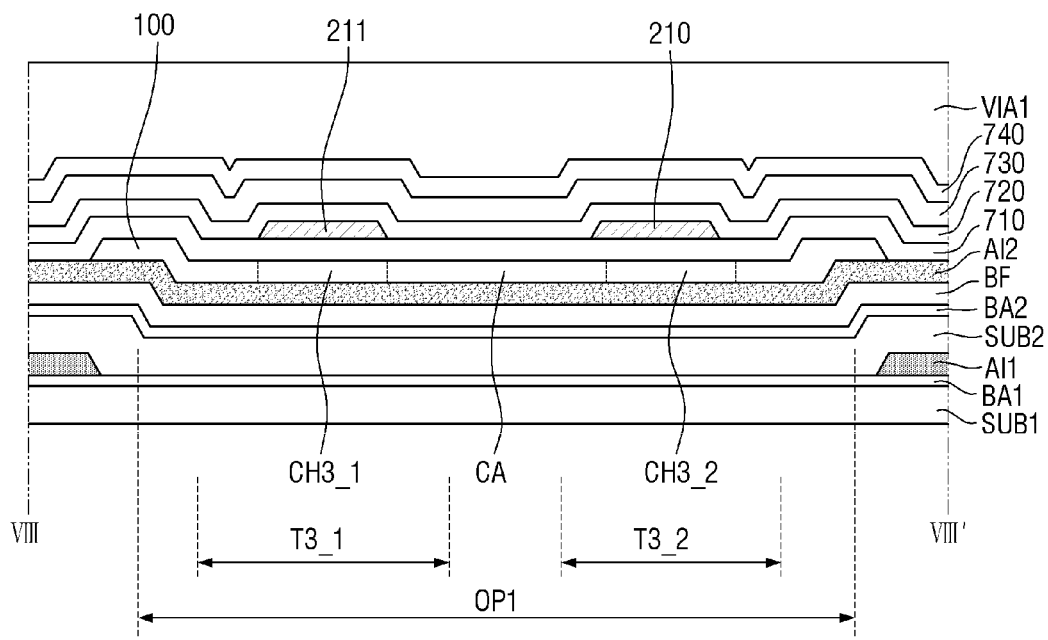
FIG. 8 illustrates a part of a cross-sectional view taken along the lines VIII-VIII in FIG. 4.

FIG. 4 is a layout view of one pixel PX of a display device according to an embodiment. FIG. 5 is a layout view of a first charge trap layer, a semiconductor layer, and a first conductive layer. FIG. 6 is a layout view of a second charge trap layer, a semiconductor layer, and a first conductive layer. FIG. 7 is a cross-sectional view taken along the line VII-VII' in FIG. 4. FIG. 8 illustrates a part of a cross-sectional view taken along the lines VIII-VIII in FIG. 4.

FIGS. 7 and 8 illustrates cross-sectional views of FIG. 4, but illustrates the first charge trap layer AI1 of FIG. 5 and the second charge trap layer AI2 of FIG. 6 together. Moreover, FIG. 7 further illustrates a fifth conductive layer 600 including an anode electrode ANO, a light emitting layer EL, a cathode electrode CAT, and a thin film encapsulation layer 770 in the layout view of FIG. 4.

Referring to FIGS. 4 to 8, as described above, each pixel PX includes a plurality of transistors T1 to T7, a capacitor ('Cst' in FIG. 3, hereinafter the same), and a light emitting element ('LE' in FIG. 3, hereinafter the same).

The capacitor Cst includes conductive layers constituting an electrode and an insulating layer disposed between the conductive layers. An organic light emitting diode (OLED) includes a conductive layer forming an anode electrode and a cathode electrode, and an organic light emitting layer disposed between the anode electrode and the cathode electrode. The electrical connections of the respective components may be performed by a wiring made of a conductive layer and/or a via made of a conductive material. The above-described conductive material, conductive layer, semiconductor layer, insulating layer, light emitting layer, etc. are disposed on the substrate.

The respective layers of the pixel PX may be arranged in order of a first substrate SUB1, a first barrier layer BA1, a first charge trap layer AI1, a second substrate SUB2, a second barrier layer BA2, a buffer layer BF, a second charge trap layer AI2, a semiconductor layer 100, a first insulating layer 710, a first conductive layer 200, a second insulating layer 720, a second conductive layer 300, a third insulating layer 730, a third conductive layer 400, a protective layer 740, a first via layer VIA1, a fourth conductive layer 500, a second via layer VIA2, a fifth conductive layer 600, a pixel defining layer PDL, a light emitting layer EL, and a cathode electrode CAT. Each of the above-described layers may be formed as a single layer, but may be formed as a laminated layer including a plurality of layers. Another layer may be further disposed between the respective layers.

The first substrate SUB1 supports each of the layers disposed on the first substrate SUB1. When an organic light emitting display device is a back or double-sided light emission type display device, a transparent substrate may be used. When the organic light emitting display device is a front emission type display device, not only a transparent substrate but also a translucent or opaque substrate may be used.

The first substrate SUB1 may be made of an insulating material such as glass, quartz, or polymer resin. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination thereof. The first substrate SUB1 may also include a metal material.

The first substrate SUB1 may be a rigid substrate, or may be a flexible substrate capable of bending, folding, rolling, or the like. An example of the material constituting the flexible substrate may be polyimide (PI).

The first barrier layer BA1 may be disposed on the first substrate SUB1. The first barrier layer BA1 may be disposed over the entire area of the first substrate SUB1. The first barrier layer BA1 may prevent the diffusion of impurity ions, may prevent the penetration of moisture or outside air, and may perform a surface planarization function. The first barrier layer BA1 may include silicon oxide ($SiO_x$). However, the first barrier layer BA1 may include silicon nitride ($SiN_x$) or silicon oxynitride ($SiO_xN_y$). The first barrier layer BA1 may be omitted depending on the type or process conditions of the first substrate SUB1.

The first charge trap layer AI1 may be disposed on the first barrier layer BA1. The first charge trap layer AI1 may include an inorganic material. The inorganic material may include, for example, silicon nitride ($SiN_x$).

The first charge trap layer AI1 serves to more firmly attach the components stacked on and under the first charge trap layer AI1 to each other. For example, as the first charge trap layer AI1 is disposed between the first substrate SUB1 and the second substrate SUB2, the first substrate SUB1 and the second substrate SUB2 are more firmly attached to each other, and thus the reliability of the display device 1 may be improved.

When the first charge trap layer AI1 includes silicon nitride ($SiN_x$), the ratio of N—H bonds in the first charge trap layer AI1 may be 1.05 at %, or may be in the range of 1 at % to 5 at % or 0.1 at % to 15 at %. Here, the ratio of N—H bonds may refer to a ratio of the number of bonds by which nitrogen (N) and hydrogen (H) atoms are bonded among all bonds in the entire area. The ratio is expressed as the atomic percent (or at %), which give the percentage of the number of bonds by which particular atoms are bonded, e.g., nitrogen (N) and hydrogen (H) atoms are bonded in this embodiment, among all bonds in the entire area. For example, one (1) at % means that the number of bonds by which nitrogen (N) and hydrogen (H) atoms are bonded is one (1) percent among all bond in the entire area.

The ratio of Si—H bonds in the first charge trap layer AI1 may be 10.02 at %, or may be in the range of 8 at % to 12 at % or 8 at % to 15 at %. Here, the ratio of Si-H bonds may refer to a ratio of the number of bonds by which silicon (Si) and hydrogen (H) atoms are bonded among all bonds in the entire area.

The ratio of Si—H bonds to N-H bonds in the first charge trap layer AI1, that is, [Si—H]/[N—H] may be in the range of 9.54, 8 to 12 or 8 to 15.

The ratio of N—H bonds, the ratio of Si—H bonds, and/or the ratio of Si—H bonds to N—H bonds may analyzed through Fourier Transform Infrared (FT-IR) Spectrometer.

The element content of Si in the first charge trap layer AI1 may be 65.05 at %, or may be in the range of 60 at % to 70 at % or 50 at % to 80 at %. The element content of N may be 31.85 at %, or may be in the range of 25 at % to 35 at % or 20 at % to 40 at %. The ratio of the element content of Si to the element content of N may be 2.04, or may be in the range of 1.6 to 2.5 or 1.1 to 3.0. The element content is expresses as the atomic percent (or at %), which gives the percentage of one kind of atom relative to the total number of atoms. For example, 60 at % of Si means that for every 100 atoms, 60 atoms are Si.

The element content of Si, the element content of N, and/or the ratio of the element content of Si to the element content of N may analyzed through Energy Dispersion X-ray Spectrometry (EDS).

When the ratio of N—H bonds, the ratio of Si—H bonds, the ratio of Si—H bonds to N—H bonds, the element content of Si, the element content of N, and the ratio of the element content of Si to the element content of N in the first charge trap layer AI1 have the above-values or are within the above ranges, the characteristics of the first transistor T1 may be improved. For example, if the ratios and the element contents are less than the above ranges, the improvement in the characteristics of the first transistor T1 may not be significant. Further, if the element contents, and the ratios are more than the above ranges, the first charge trap layer AI1 may not be formed easily.

When the first charge trap layer AI1 includes silicon nitride (SiNx), the first charge trap layer AI1 may be formed under an ammonia-free ($NH_3$-free) condition. In other words, the first charge trap layer AI1 may be formed by chemical vapor deposition (CVD). In this case, the first charge trap layer AI1 may be formed by adjusting the amounts of nitrogen ($N_2$) and silane ($SiH_4$) added. In this process, ammonia ($NH_3$) may not be added.

When the first charge trap layer AI1 is formed under an ammonia-free ($NH_3$-free) condition, the refractive index of the first charge trap layer AI1 may be 2.7774, or may be in the range of 2.3 to 3.0 or 2.0 to 3.5.

Figure 9:
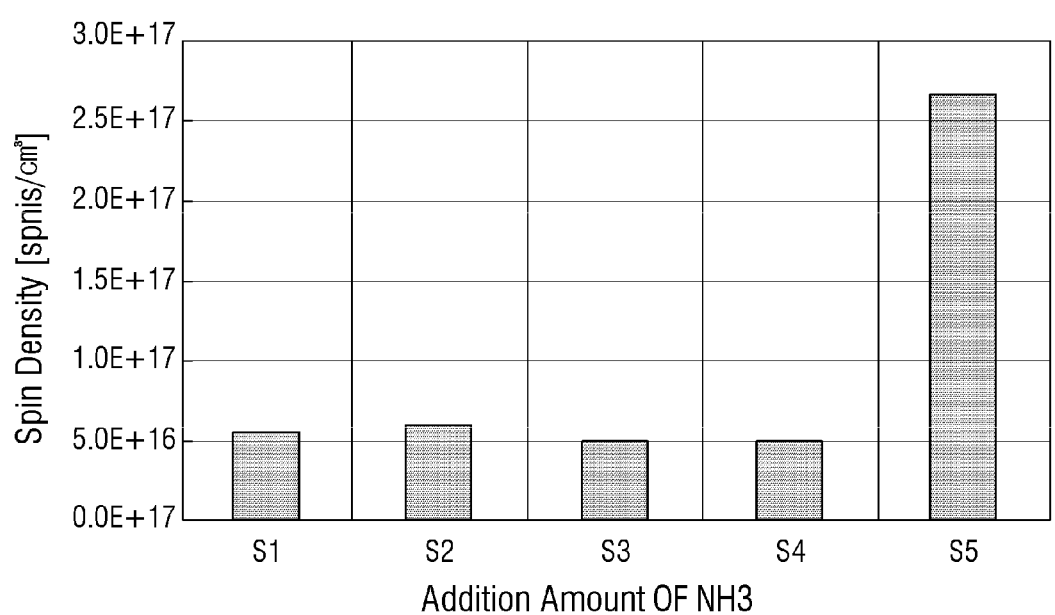
FIG. 9 is a graph illustrating spin density depending on an addition amount of ammonia ($NH_3$) in a process of forming a first charge trap layer according to an embodiment.

FIG. 9 is a graph illustrating spin density depending on addition amount of ammonia ($NH_3$) in the process of forming a first charge trap layer according to an embodiment. In the graph of FIG. 9, the X-axis represents an addition amount of ammonia, and the Y-axis represents spin density.

In the graph of FIG. 9, S1 represents a case where the addition amount of ammonia is 2000 sccm (standard cubic centimeter per minute), S2 represents a case where the addition amount of ammonia is 1000 sccm, S3 represents a case where the addition amount of ammonia is 500 sccm, S4 represents a case where the addition amount of ammonia is 100 sccm, and S5 represents a case where ammonia is not added (ammonia-free).

Further, referring to FIG. 9, it may be found that spin density increases when ammonia is not added (S5) than when ammonia is added (S1, S2, S3, and S4) in the process of forming the first charge trap layer AI1. The spin density is a factor related to defect density, and may be a measure of determining defect density.

In other words, the spin density of the first charge trap layer AI1 formed under the condition of ammonia-free ($NH_3$-free) may increase. Accordingly, the defect density of the first charge trap layer AI1 may increase, and the amount of charge trapped in the first charge trap layer AI1 may increase. For example, when the first charge trap film AI1 is formed under the condition of ammonia-free ($NH_3$-free), the number of Si (silicon) bonded to 3 or less N (nitrogen) among Si (silicon) atoms of the first charge trap layer AI1 may increase. Some of the outermost electrons of Si (silicon) that are not bonded to N (nitrogen) and are not bonded to other atoms may have a tendency to be stabilized by bonding with external electrons (−). Accordingly, the number of electrons (−) trapped in the first charge trap layer AI1 may increase. That is, when the first charge trap layer AI1 is formed under an ammonia-free ($NH_3$-free), the amount of charge trapped in the first charge trap layer AI1 may increase.

Accordingly, element characteristics of the first transistor T1 may be improved. Moreover, the luminance of the display device 1 (refer to FIG. 1) may be improved, and afterimages (instantaneous afterimages and long-term afterimages) may be improved.

Moreover, the first charge trap layer AI1 may be disposed under the first transistor T1, and may not be disposed under the third transistor T3 (T3_1 and T3_2). The first charge trap layer AI1 may overlap at least a channel region CH1 of the first transistor T1 in the thickness direction, and may not overlap at least a channel region CH3_1 or CH3_2 of the third transistor T3 (T3_1 and T3_2).

For example, the first charge trap layer AI1 may be disposed on the entire surface of the first substrate SUB1 and may include a first opening OP1 penetrating in the thickness direction. That is, the first charge trap layer AI1 may define a first opening OP1 penetrating in the thickness direction. The first opening OP1 may be formed in various shapes in a plan view. For example, the first opening OP1 may be formed in a rectangular shape, and may include a polygonal shape such as a rectangle, a square, or a pentagon, or may include a circular or elliptic shape. The first opening OP1 may be disposed in an area where the channel region CH3_1 or CH3_2 of the third transistor T3 (T3_1 and T3_2) is disposed. The first charge trap layer AI1 may be disposed on the entire surface of the first substrate SUB1, and may be selectively removed from the area where the third transistor T3 is disposed.

In this case, the first charge trap layer AI1 may overlap the channel region CH1 of the first transistor T1 in the thickness direction. In addition, the first charge trap layer AI1 may overlap the channel region of each of the second transistor T2, the fourth transistor T4 (T4_1 and T4_2), the fifth transistor T5, the sixth transistor T6, and the seventh transistor T7 in the thickness direction. The channel region CH3_1 or CH3_2 of the third transistor T3 (T3_1 and T3_2) may overlap the first opening OP1 in the thickness direction, and the third transistor T3 (T3_1 and T3_2) may not overlap the first charge trap layer AI1. In other words, the first opening OP1 may surround the channel region CH3_1 or CH3_2 of the third transistor T3 (T3_1 and T3_2).

As the first charge trap layer AI1 is disposed under the first transistor T1 and is not disposed under the third transistors T3 (T3_1 and T3_2), the element characteristics of the first transistor T1 and the element characteristics of the third transistor T3 (T3_1 and T3_2) may be individually controlled. For example, the first charge trap layer AI1 may be disposed under the first transistor T1 to improve the element characteristics of the first transistor T1, and the first charge trap layer AI1 may be selectively omitted under the third transistor T3 to prevent the deterioration in element characteristics of the third transistor T3. Details will be described later.

The second substrate SUB2 may be disposed on the first charge trap layer AI1. The description of the first substrate SUB1 may be applied to the second substrate SUB2 in the same manner. Therefore, a detailed description of the second substrate SUB2 will be omitted.

The second barrier layer BA2 may be disposed on the second substrate SUB2. The description of the first barrier layer BA1 may be applied to the second barrier layer BA2 in the same manner. Therefore, a detailed description of the second barrier layer BA2 will be omitted.

The buffer layer BF may be disposed on the second barrier layer BA2. The buffer layer BF may be disposed on the entire surface of the barrier layer BA, which includes the first and second barrier layers BA1, BA2. The buffer layer BF may prevent the diffusion of impurity ions, may prevent the penetration of moisture or external air, and may perform a surface planarization function. The buffer layer BF may include silicon nitride, but the buffer layer BF may include silicon oxide or silicon oxynitride. The buffer layer BF may be omitted depending on the type of the base substrate SUB1 or process conditions.

The second charge trap layer AI2 may be disposed on the buffer layer BF. The second charge trap layer AI2 may include an inorganic material. The inorganic material may include silicon oxide ($SiO_x$).

When the second charge trap layer AI2 includes silicon oxide ($SiO_x$), the ratio of N—H bonds in the second charge trap layer AI2 may be 0.73 at %, or may be in the range of 0.7 at % to 1.3 at % or 0.7 at % to 1.5 at %. Here, the ratio of N—H bonds may refer to a ratio of the number of bonds by which nitrogen (N) and hydrogen (H) atoms are bonded among all bonds in the entire area.

The ratio of N—H bonds may be analyzed through Fourier Transform Infrared (FT-IR) Spectrometer.

When the ratio of N—H bonds has the above-value or is within the above range, the characteristics of the first transistor T1 may be improved. For example, if the ratio of N—H bonds is less than the above range, the improvement in the characteristics of the first transistor T1 may not be significant. Further, if the ratio of N—H bonds is more than the above range, the second charge trap layer AI2 may not be formed easily.

When the second charge trap layer AI2 includes silicon oxide ($SiO_x$), the second charge trap layer AI2 may be formed by chemical vapor deposition (CVD). In this case, the second charge trap layer AI2 may be formed by adjusting the amounts of nitrous oxide ($N_2O$) and silane ($SiH_4$) added.

Nitrogen (N) may be located at the interface between the second charge trap layer AI2 and the semiconductor layer ACT. N located at the interface may have a tendency to be stabilized by bonding with external electrons (−) of some of the outermost electrons of N that are not bonded to other atoms, and a larger number of electrons (—) may be trapped in the second charge trap layer AI2. Therefore, when the ratio of N—H bonds in the second charge trap layer AI2 has the above value or is within the above range, the amount of charge trapped in the second charge trap layer AI2 may increase.

Accordingly, element characteristics of the first transistor T1 may be improved. Moreover, the luminance of the display device 1 (refer to FIG. 1) may be improved, and afterimages (instantaneous afterimages and long-term afterimages) may be improved. In addition, doping of the channel regions of the active layers of the first to seventh transistors T1 to T7 may be omitted. Accordingly, the channel region of at least one of the first to seventh transistors T1 to T7 may not contain impurities such as boron (B) or fluorine (F). Details will be described later.

The semiconductor layer 100 may be disposed on the second charge trap layer AI2. The semiconductor layer 100 is an active layer that forms the first region, second region, and channel (or channel region) contacting the first and second electrodes of each of the first to seventh transistors T1 to T7. One of the first and second regions becomes a source region, and the other one of the first and second regions becomes a drain region.

Hereinafter, in the plan view, the right side will be referred to as one side in the first direction DR1, and the left side will be referred to as the other side in the first direction DR1. Further, in the plan view, the upper side will be referred to as one side in the second direction DR2, and the lower side will be referred to as the other side in the second direction DR2.

The semiconductor layer 100 may be connected to each other for each pixel PX without being separated from each other. The semiconductor layer 100 may have a specific pattern in a plan view. For example, the semiconductor layer 100 may include a first vertical portion 110, a second vertical portion 120, a third vertical portion 150, a fourth vertical portion 160, and a fifth vertical portion 170, which extend substantially in the second direction DR2; a first horizontal portion 130 and a second horizontal portion 140, which extend substantially in the first direction DR1; and first to third connection portions 181, 182, and 183 connecting some of the plurality of vertical portions 110, 120, 150, 160, and 170 and some of the plurality of horizontal portions 130 and 140. The plurality of vertical portions 110, 120, 150, 160, 170, the plurality of horizontal portions 130, 140, and the first to third connecting portions 181, 182, and 183 may be physically connected to each other.

The first vertical portion 110 may be disposed adjacent to the other side of one pixel PX in the first direction DR1, and the second vertical portion 120 may be disposed adjacent to one side of the pixel PX in the first direction DR1. The first vertical portion 110 and the second vertical portion 120 may be disposed to be spaced apart from each other. The first vertical portion 110 may have a longer length in the second direction DR2 than the second vertical portion 120. The first horizontal portion 130 may connect an intermediate portion between the first vertical portion 110 and the second vertical portion 120. In the present specification, the "upper portions 111 and 121" of the first vertical portion 110 and the second vertical portion 120 may refer to portions located at one side of a portion connected to the first horizontal portion 130 in the second direction DR2 in a plan view, respectively. The "lower portions 112 and 122" of the first vertical portion 110 and the second vertical portion 120 may refer to portions located at the other side of a portion connected to the first horizontal portion 130 in the second direction DR2 in a plan view, respectively. The planar shapes of the first vertical portion 110, the second vertical portion 120, and the first horizontal portion 130 may be substantially similar to an 'H' shape.

The first horizontal portion 130 may connect the first vertical portion 110 and the second vertical portion 120 with the shortest distance, but, as shown in the drawing, may include a first bent portion 131 at the other side of the first horizontal portion 130 in the first direction DR1 and a second bent portion 132 at one side of the first horizontal portion 130 in the first direction DR1. The total length of the first horizontal portion 130 may be increased by bending a plurality of times.

The second horizontal portion 140 may extend from one end of the upper portion 121 of the second vertical portion 120 in the second direction DR2 to the other side in the first direction DR1, and may be disposed at one side of the first horizontal portion 130 in the second direction DR2. The other region of the second horizontal portion 140 in the first direction DR1 may have a larger width in the second direction DR2 than other regions.

The third vertical portion 150, the fourth vertical portion 160, and the fifth vertical portion 170 may be disposed at one side of the second horizontal portion 140 in the second direction DR2. The third vertical portion 150 may be disposed at the other side of the fifth vertical portion 170 in the second direction DR2, and the fourth vertical portion 160 may be disposed between the third vertical portion 150 and the fifth vertical portion 170. The other end of the fourth vertical portion 160 in the second direction DR2 may be connected to the fourth vertical portion 160, but one end of the fourth vertical portion 160 in the second direction DR2 may be connected to the lower portion 122 of the second vertical portion 120 of another adjacent pixel PX.

The first connection portion 181 may be disposed between the other end of the second horizontal portion 140 in the first direction DR1 and the other end of the third vertical portion 150 in the second direction DR2. The first connection portion 181 may connect the second horizontal portion 140 and the third vertical portion 150, and may be formed to be inclined in the first direction DR1 and the second direction DR2.

The second connection portion 182 may be disposed between one end of the third vertical portion 150 in the second direction DR2 and one end of the fourth vertical portion 160 in the second direction DR2. The second connection portion 182 may connect the third vertical portion 150 and the fourth vertical portion 160.

The third connection portion 183 may be disposed between the other end of the fourth vertical portion 160 in the second direction DR2 and the other end of the fifth vertical portion 170 in the second direction DR2. The third connection portion 183 may connect the fourth vertical portion 160 and the fifth vertical portion 170.

The planar shapes of the third vertical portion 150, the fourth vertical portion 160, the fifth vertical portion 170, the second connecting portion 182, and the third connecting portion 183 may be substantially similar to a substantially inverted and laid down 'S' shape.

The channel of the second transistor T2 may be disposed in the upper portion 111 of the first vertical portion 110, and the channel of the fifth transistor T5 may be disposed in the lower portion 112 of the first vertical portion. The channel of the second sub-transistor T3_2 may be disposed in the upper portion 121 of the second vertical portion 120. The channel of the first transistor T1 may be disposed in the first horizontal portion 130. The channel of the first sub-transistor T3_1 may be disposed in the second horizontal portion 140. The channel of the third sub-transistor T4_1 may be disposed in the third vertical portion 150, and the channel of the fourth sub-transistor T4_2 may be disposed in the fourth vertical portion 160. The channel of the seventh transistor T7 may be disposed in the fifth vertical portion 170.

The semiconductor layer 100 may include polycrystalline silicon. Polycrystalline silicon may be formed by crystallizing amorphous silicon. Examples of the crystallization method may include rapid thermal annealing (RTA), solid phase crystallization (SPC), excimer laser annealing (ELA), metal induced crystallization (MIC), metal induced lateral crystallization (MILC), and sequential lateral solidification (SLS).

As another example, the semiconductor layer 100 may include single crystal silicon, low-temperature polycrystalline silicon, amorphous silicon, or the like, or may include an oxide semiconductor.

The first insulating layer 710 may be disposed on the semiconductor layer 100, and may be disposed over the entire surface of the base substrate SUB1. The first insulating layer 710 may be a gate insulating layer having a gate insulating function.

The first insulating layer 710 may include a silicon compound, a metal oxide, or the like. For example, the first insulating layer 710 may include silicon oxide, silicon nitride, silicon oxynitride, aluminum oxide, tantalum oxide, hafnium oxide, zirconium oxide, titanium oxide, or the like. They may be used alone or in combination with each other.

The first conductive layer 200 is disposed on the first insulating layer 710. The first conductive layer 200 may include a first scan line 210 transmitting a first scan signal ('GW' in FIG. 3, hereinafter the same), a gate electrode 240 of the first transistor T1, a light emission control line 220 transmitting a light emission control signal ('EM' in FIG. 3, hereinafter the same), and a second scan line 230 supplying a second scan signal ('GI' in FIG. 3, hereinafter the same).

The first scan line 210 includes a gate electrode of the second transistor T2, a gate electrode of the first sub-transistor T3_1, and a gate electrode of the second sub-transistor T3_2. The light emission control line 220 may include a gate electrode of the fifth transistor T5 and a gate electrode of the sixth transistor T6. Further, the second scan line 230 may include a gate electrode of the third sub-transistor T4_1, a gate electrode of the fourth sub-transistor T4_2, and a gate electrode of the seventh transistor T7.

Each of the first scan line 210, the light emission control line 220, and the second scan line 230 may extend along the first direction DR1. Each of the first scan line 210, the light emission control line 220, and the second scan line 230 may extend to the neighboring pixel PX beyond the boundary of the pixels PX along the first direction DR1.

The first scan line 210 may be located around the center of the pixel PX, and may overlap the upper portion 111 of the first vertical portion 110 of the semiconductor layer 100 and the upper portion 121 of the second vertical portion 120 of the semiconductor layer 100.

The first scan line 210 may form a gate electrode of the second transistor T2 at a portion overlapping the upper portion 111 of the first vertical portion 110 of the semiconductor layer 100. The first vertical portion 110 of the semiconductor layer 100, located at one side of the overlapping portion in the second direction DR2, becomes a first region of the second transistor T2, and the first vertical portion 110 of the semiconductor layer 100, located at the other side of the overlapping portion in the second direction DR2, becomes a second region of the second transistor T2.

The first scan line 210 may form a gate electrode of the second sub-transistor T3_2 at a portion overlapping the upper portion 121 of the second vertical portion 120 of the semiconductor layer 100. The second vertical portion 120 of the semiconductor layer 100, located at one side of the overlapping portion in the second direction DR2, becomes a second region of the second sub-transistor T3_2, and the second vertical portion 120 of the semiconductor layer 100, located at the other side of the overlapping portion in the second direction DR2, becomes a first region of the second sub-transistor T3_2.

The first scan line 210 may further include a first scan line protrusion portion 211. The first scan line protrusion portion 211 may protrude from the first scan line 210 extending in the first direction DR1 toward one side of the first scan line 210 in the second direction DR2.

The first scan line protrusion portion 211 may overlap the second horizontal portion 140 of the semiconductor layer 100, and may form a gate electrode of the first sub-transistor T3_1 at the corresponding overlapping portion. The second horizontal portion 140 of the semiconductor layer 100, located at one side of the overlapping portion in the first direction DR1, becomes a first region of the first sub-transistor T3_1, and the second horizontal portion 140 of the semiconductor layer 100, located at the other side of the overlapping portion in the first direction DR1, becomes a second region of the first sub-transistor T3_1.

The light emission control line 220 may be located at the other side of the pixel PX in the second direction DR2 in a plan view, and may overlap the lower portion 112 of the first vertical portion 110 of the semiconductor layer 100 and the lower portion 122 of the second vertical portion 120 of the semiconductor layer 100.

The light emission control line 220 may form a gate electrode of the fifth transistor T5 at a portion overlapping the lower portion 112 of the first vertical portion 110 of the semiconductor layer 100. The first vertical portion 110 of the semiconductor layer 100, located at one side of the overlapping portion in the second direction DR2, becomes a second region of the fifth transistor T5, and the first vertical portion 110 of the semiconductor layer 100, located at the other side of the overlapping portion in the second direction DR2, becomes a first region of the fifth transistor T5.

The light emission control line 220 may form a gate electrode of the sixth transistor T6 at a portion overlapping the upper portion 121 of the second vertical portion 120 of the semiconductor layer 100. The second vertical portion 120 of the semiconductor layer 100, located at one side of the overlapping portion in the second direction DR2, becomes a first region of the sixth transistor T6, and the second vertical portion 120 of the semiconductor layer 100, located at the other side of the overlapping portion in the second direction DR2, becomes a second region of the sixth transistor T6.

The second scan line 230 may be located at one side of the pixel PX in the second direction DR2 in a plan view, and may overlap the third vertical portion 150, the fourth vertical portion 160, and the fifth vertical portion 170 of the semiconductor layer 100.

The second scan line 230 may form a gate electrode of the third sub-transistor T4_1 at a portion overlapping the third vertical portion 150 of the semiconductor layer 100. The third vertical portion 150 of the semiconductor layer 100, located at one side of the overlapping portion in the second direction DR2, becomes a second region of the third sub-transistor T4_1, and the third vertical portion 150 of the semiconductor layer 100, located at the other side of the overlapping portion in the second direction DR2, becomes a first region of the third sub-transistor T4_1.

The second scan line 230 may form a gate electrode of the fourth sub-transistor T4_2 at a portion overlapping the fourth vertical portion 160 of the semiconductor layer 100. The fourth vertical portion 160 of the semiconductor layer 100, located at one side of the overlapping portion in the second direction DR2, becomes a first region of the fourth sub-transistor T4_2, and the fourth vertical portion 160 of the semiconductor layer 100, located at the other side of the overlapping portion in the second direction DR2, becomes a second region of the fourth sub-transistor T4_2.

The second scan line 230 may form a gate electrode of the seventh transistor T7 at a portion overlapping the fifth vertical portion 170 of the semiconductor layer 100. The fifth vertical portion 170 of the semiconductor layer 100, located at one side of the overlapping portion in the second direction DR2, becomes a second region of the seventh transistor T7, and the fifth vertical portion 170 of the semiconductor layer 100, located at the other side of the overlapping portion in the second direction DR2, becomes a first region of the seventh transistor T7.

The gate electrodes of the second to seventh transistors T2 to T7 may have a width greater than that of the peripheral line at the corresponding portion.

The gate electrode 240 of the first transistor T1 may be located at the center of the pixel PX. The gate electrode 240 of the first transistor T1 may be located between the first scan line 210 and the light emission control line 220 in a plan view. The gate electrode 240 of the first transistor T1 for each pixel PX may be separated.

The gate electrode 240 of the first transistor T1 overlaps the first horizontal portion 130 of the semiconductor layer 100. The first horizontal portion 130 of the semiconductor layer 100, located at the other side of the overlapping portion in the first direction DR1, becomes a first region of the first transistor T1, and the first horizontal portion 130 of the semiconductor layer 100, located at one side of the overlapping portion in the first direction DR1, becomes a second region of the first transistor T1.

The first conductive layer 200 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The second insulating layer 720 serves to insulate the first conductive layer 200 and the second conductive layer 300. The second insulating layer 720 may be disposed on the first conductive layer 200, and may be generally disposed over the entire surface of the base substrate SUB1. The second insulating layer 720 may be an interlayer insulating layer.

The second insulating layer 720 may include an inorganic insulating material such as silicon oxide, silicon nitride, silicon oxynitride, hafnium oxide, aluminum oxide, titanium oxide, tantalum oxide, or zinc oxide, or may include an organic insulating material such as acrylic resin (polyacrylate resin), epoxy resin, phenolic resin, polyamide resin, polyimide resin, unsaturated polyester resin, poly polyphenylene resin (polyphenylene ether resin), polyphenylene sulfide resin, or benzocyclobutene (BCB). The second insulating layer 720 may be a single layer or multiple layers formed of laminated layers of different materials.

The second conductive layer 300 is disposed on the second insulating layer 720. The second conductive layer 300 may include a capacitor electrode line 310, an initialization voltage line 320 supplying an initialization voltage ('VINT' in FIG. 3, hereinafter the same).

Each of the capacitor electrode line 310 and the initialization voltage line 320 may extend along the first direction DR1. Each of the capacitor electrode line 310 and the initialization voltage line 320 may extend to the neighboring pixel PX beyond the boundary of the pixels PX along the first direction DR1.

The capacitor electrode line 310 crosses the center of the pixel PX, and is disposed to overlap the gate electrode 240 of the underlying first transistor T1 with the second insulating layer 720 interposed between the capacitor electrode line 310 and the gate electrode 240 to form a capacitor Cst. The gate electrode 240 of the first transistor T1 may become a first electrode of the capacitor Cst, the enlarged area of the capacitor electrode line 310 overlapping the first transistor T1 may become a second electrode of the capacitor Cst, and the second insulating layer 720 interposed between the capacitor electrode line 310 and the gate electrode 240 may become a dielectric of the capacitor Cst.

The width of the capacitor electrode line 310 may be enlarged in an area overlapping the gate electrode 240 of the first transistor T1. The capacitor electrode line 310 may include an opening overlapping the gate electrode 240 of the underlying first transistor T1 in the enlarged area.

The initialization voltage line 320 may be located at one side of the pixel PX in the second direction DR2 in a plan view. The initialization voltage line 320 may overlap the fifth vertical portion 170 of the semiconductor layer 100.

The second conductive layer 300 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The third insulating layer 730 covers the second conductive layer 300. The third insulating layer 730 may be disposed over the entire surface of the base substrate SUB1. The third insulating layer 730 may be an interlayer insulating layer. The third insulating layer 730 may include the same material as the second insulating layer 720, or may include at least one selected from the materials exemplified as the constituent materials of the second insulating layer 720.

The third conductive layer 400 is disposed on the third insulating layer 730. The third conductive layer 400 may include a plurality of data patterns 410 and 420, a first anode connection electrode 430 for electrically connecting the anode electrode ANO of the light emitting element LE (refer to FIG. 3) to the semiconductor layer 100, a first power voltage line 440 supplying a first power voltage ('ELVDD' in FIG. 3, hereinafter the same), and a data line 450 for transmitting a data signal ('DATA' in FIG. 3, hereinafter the same).

The third conductive layer 400 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu). The third conductive layer 400 may be a single layer or multiple layers. For example, the third conductive layer 400 may be formed in a laminated structure of Ti/Al/Ti, Mo/Al/Mo, Mo/AlGe/Mo, and Ti/Cu.

The plurality of data patterns may include the first data pattern 410 and the second data pattern 420. Each of the data patterns 410 and 420 may generally have a shape extending in the second direction DR2, and the length of each of the data patterns 410 and 420 in the second direction DR2 may be smaller than the length of the pixel PX in the second direction DR2. The data patterns 410 and 420 may be physically spaced apart from each other. Each of the data patterns 410 and 420 may electrically connect portions separated from each other.

The first data pattern 410 may overlap the gate electrode 240 of the first transistor T1. In the overlapping area, the first data pattern 410 may be electrically connected to the gate electrode 240 of the first transistor T1 through a first contact hole CNT1 penetrating the third insulating layer 730 and the second insulating layer 720 to expose the gate electrode 240 of the first transistor T1. The first contact hole CNT1 may be located in the opening of the capacitor electrode line 310. The first data pattern 410 inside the first contact hole CNT1 and the capacitor electrode line 310 adjacent to the first data pattern 410 may be insulated from each other through the third insulating layer 730.

Further, the first data pattern 410 may extend upward from an overlapping area with the gate electrode 240 of the first transistor T1 to insulate and intersect the first scan line 210, and may overlap a part of the second horizontal portion 140 of the semiconductor layer 100. In the overlapping area, the first data pattern 410 may be electrically connected to the second horizontal portion 140 of the semiconductor layer 100 through a second contact hole CNT2 penetrating the third insulating layer 730, the second insulating layer 720, and the first insulating layer 710 to expose a part of the second horizontal portion 140 of the semiconductor layer 100. A part of the second horizontal portion 140 may be a second region of the first sub-transistor T3_1.

In other words, the first data pattern 410 may electrically connect the gate electrode 240 of the first transistor T1 and the second horizontal portion 140 of the semiconductor layer 100.

The second data pattern 420 may overlap the third connection portion 183 of the semiconductor layer 100. In the overlapping area, the second data pattern 420 may be electrically connected to the third connection portion 183 of the semiconductor layer 100 through a fourth contact hole CNT4 penetrating the third insulating layer 730, the second insulating layer 720, and the first insulating layer 710 to expose the third connection portion 183 of the semiconductor layer 100.

Further, the second data pattern 420 may extend upward from an overlapping area with the third connection portion 183 of the semiconductor layer 100 to insulate and intersect the second scan line 230, and may overlap the initialization voltage line 320. In the overlapping area, the second data pattern 420 may be electrically connected to the initialization voltage line 320 through a fifth contact hole CNT5 penetrating the third insulating layer 730 to expose the initialization voltage line 320.

In other words, the second data pattern 420 may electrically connect the third connection portion 183 of the semiconductor layer 100 to the initialization voltage line 320.

The first anode connection electrode 430 generally has a shape extending in the second direction DR2, but the length of the first anode connection electrode 430 in the second direction DR2 is smaller than the length of the pixel PX in the second direction DR2. The first anode connection electrode 430 is physically spaced apart from the plurality of data patterns 410 and 420. The first anode connection electrode 430 may connect the semiconductor layer 100 to the anode electrode ANO together with a second anode connection electrode 530 to be described later.

The first anode connection electrode 430 may overlap the lower portion 122 of the second vertical portion 120 of the semiconductor layer 100. The first anode connection electrode 430 may be electrically connected to the lower portion 122 of the second vertical portion 120 of the semiconductor layer 100 through a sixth contact hole CNT6 penetrating the third insulating layer 730, the second insulating layer 720, and the first insulating layer 710 to expose the lower portion 122 of the second vertical portion 120 of the semiconductor layer 100.

The first power voltage line 440 may extend along the second direction DR2. The first power voltage line 440 may extend to the neighboring pixel PX beyond the boundary of the pixels PX along the second direction DR2. The first power voltage line 440 is substantially adjacent to the left side of the pixel PX, but may be disposed at one side of the data line 450 in the first direction DR1. The first power voltage line 440 may be electrically connected to the capacitor electrode line 310 through an eighth contact hole CNT8 penetrating the third insulating layer 730 to expose the capacitor electrode line 310.

Further, the first power voltage line 440 may be electrically connected to the lower portion 112 of the first vertical portion 110 of the semiconductor layer 100 through a seventh contact hole CNT7 penetrating the third insulating layer 730, the second insulating layer 720, and the first insulating layer 710 to expose the lower portion 112 of the first vertical portion 110 of the semiconductor layer 100.

The data line 450 may extend along the second direction DR2. The data line 450 may extend to the neighboring pixel PX beyond the boundary of the pixels PX along the second direction DR2. The data line 450 may be disposed adjacent to the other side of the pixel PX in the first direction DR1. The data line 450 may overlap the first vertical portion 110 of the semiconductor layer 100.

The data line 450 may be electrically connected to the upper portion 111 of the first vertical portion 110 of the semiconductor layer 100 through a third contact hole CNT3 penetrating the third insulating layer 730, the second insulating layer 720, and the first insulating layer 710 to expose the upper portion 111 of the first vertical portion 110 of the semiconductor layer 100. The third contact hole CNT3 may be located under the second scan line 230 in a plan view.

The protective layer 740 may be formed on the third conductive layer 400. The protective layer 740 may be formed of an inorganic layer, for example, a silicon nitride layer, a silicon oxynitride layer, a silicon oxide layer, a titanium oxide layer, or an aluminum oxide layer. However, in some embodiments, the protective layer 740 may be omitted.

The first via layer VIA1 is disposed on the protective layer 740. The first via layer VIA1 may be a planarization layer. The first via layer VIA1 may include an inorganic insulating material, or may be include an organic insulating material such as acrylic resin (polyacrylate resin), epoxy resin, phenolic resin, polyamide resin, polyimide resin, unsaturated polyester resin, poly polyphenylene resin (polyphenylene ether resin), polyphenylene sulfide resin, or benzocyclobutene (BCB).

The fourth conductive layer 500 is disposed on the first via layer VIAL The fourth conductive layer 500 may include at least one metal selected from molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu).

The fourth conductive layer 500 may include the second anode connection electrode 530. A first anode contact hole ACNT1 penetrating the first via layer VIA1 and the protective layer 740 to expose the first anode connection electrode 430 may be disposed in the first via layer VIAL The second anode connection electrode 530 may be connected to the first anode connection electrode 430 through the first anode contact hole ACNT1.

The second via layer VIA2 is disposed on the fourth conductive layer 500. The second via layer VIA2 may be a planarization layer. The second via layer VIA2 may include an inorganic insulating material, or may be include an organic insulating material such as acrylic resin (polyacrylate resin), epoxy resin, phenolic resin, polyamide resin, polyimide resin, unsaturated polyester resin, poly polyphenylene resin (polyphenylene ether resin), polyphenylene sulfide resin, or benzocyclobutene (BCB).

The fifth conductive layer 600 is disposed on the second via layer VIA2. The fifth conductive layer 600 may include the anode electrode ANO. The anode electrode ANO may be separately disposed for each pixel PX. The anode electrode ANO may be electrically connected to the second anode connection electrode 530 through a second anode contact hole ACNT2 penetrating the second via layer VIA2 to expose the second anode connection electrode 530.

The anode electrode ANO may have a laminated film structure in which a high-work-function material layer including Indium-Tin-Oxide (ITO), Indium-Zinc-Oxide (IZO), Zinc Oxide (ZnO), or Indium Oxide ($In_2O_3$) and a reflective material layer including silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are laminated. The high-work-function material layer may be disposed over the reflective material layer to be closer to the light emitting layer EL. The anode electrode ANO may have a multi-layer structure of ITO/Mg, ITO/MgF, ITO/Ag, or ITO/Ag/ITO.

The pixel defining layer PDL may be disposed on the fifth conductive layer 600. The pixel defining layer PDL may include an opening partially exposing the anode electrode ANO. The pixel defining layer PDL may include an organic insulating material or an inorganic insulating material. For example, the pixel defining layer PDL may include at least one of polyimide resin, acrylic resin, a silicon compound, and polyacrylic resin.

The light emitting layer EL may be further disposed on the anode electrode ANO exposed by the pixel defining layer PDL. The light emitting layer EL may include an organic material layer. The organic material layer of the light emitting layer EL may include an organic light emitting layer, and may further include a hole injection/transport layer and/or an electron injection/transport layer.

The cathode electrode CAT may be disposed on the light emitting layer EL. The cathode electrode CAT may be a common electrode that is entirely disposed regardless of the pixels PX. The anode electrode ANO, the light emitting layer EL, and the cathode electrode CAT may constitute an organic light emitting element.

The cathode electrode CAT may include a low-work-function material layer including Li, Ca, LiF/Ca, LiF/Al, Al, Mg, Ag, Pt, Pd, Ni, Au Nd, Ir, Cr, BaF, Ba, a compound thereof, or a mixture thereof (for example, a mixture of Ag and Mg). The cathode electrode CAT may further include a transparent metal oxide layer disposed on the low-work-function material layer.

The anode electrode ANO, the light emitting layer EL, and the cathode electrode CAT may constitute an organic light emitting element.

The thin film encapsulation layer 770 is disposed on the cathode electrode CAT. The thin film encapsulation layer 770 may include a first inorganic layer 771, a first organic layer 772, and a second inorganic layer 773. At the ends of the thin film encapsulation layer 770, the first inorganic layer 771 and the second inorganic layer 773 may contact each other. The first organic layer 772 may be encapsulated by the first inorganic layer 771 and the second inorganic layer 773.

Each of the first inorganic layer 771 and the second inorganic layer 773 may each include silicon nitride, silicon oxide, or silicon oxynitride. The first organic layer 772 may include an organic insulating material.

As described above, since the display device 1 (refer to FIG. 1) includes the first charge trap layer AI1 and the second charge trap layer AI2, luminance may increase, and afterimages may be improved.

Figure 10:
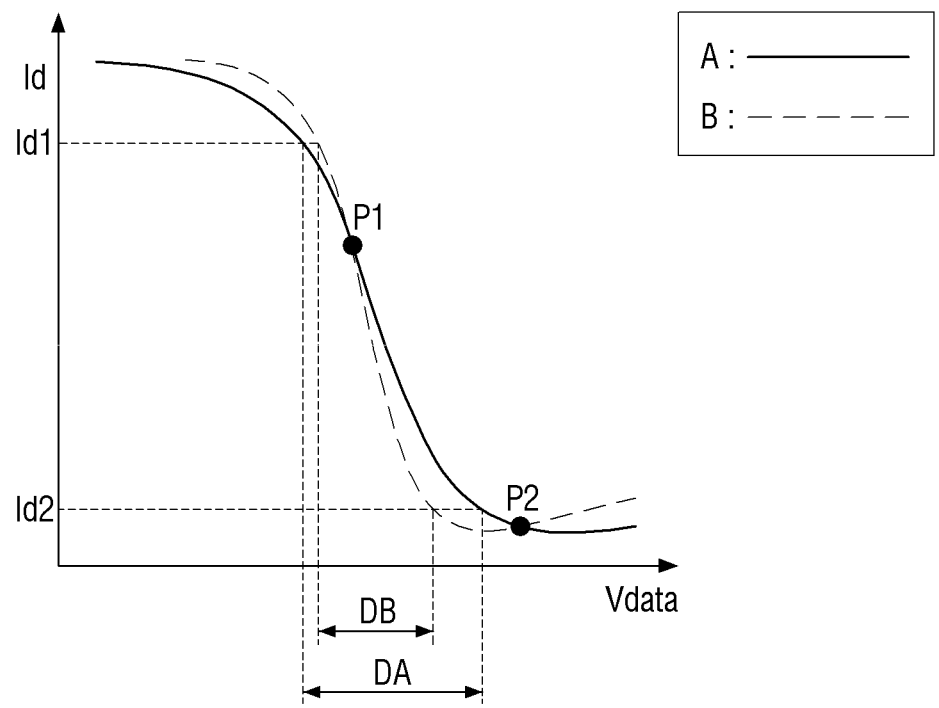
FIG. 10 is a graph of a driving current with respect to a data voltage of a first transistor according to an embodiment.
Figure 11:
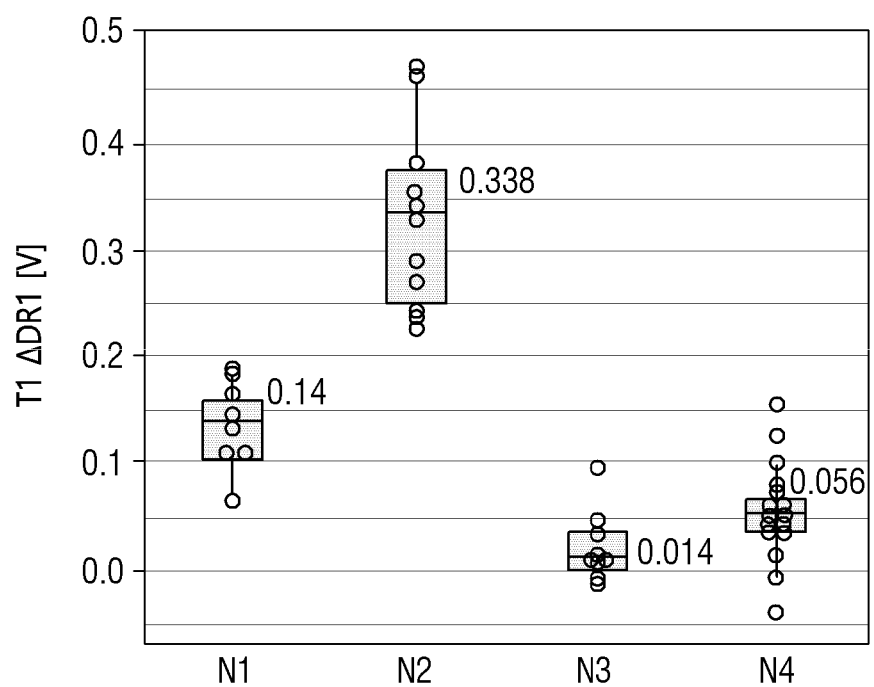
FIG. 11 is a graph illustrating a change ΔDR1 in a driving range of a first transistor according to whether a first charge trap layer and a second charge trap layer are arranged.

FIGS. 10 and 11 are referred to in order to explain a change in element characteristics of the first transistor T1.

FIG. 10 is a graph of a driving current with respect to a data voltage of a first transistor according to an embodiment. FIG. 11 is a graph illustrating a change (ADR1) in driving range of a first transistor according to whether a first charge trap layer and a second charge trap layer are arranged.

Referring to FIG. 10, graph A represents an I-V (current-voltage) graph of the first transistor T1, and graph B represents an I-V (current-voltage) graph when the driving range is increased than that of the first transistor T1 of graph A.

Graph A and graph B cross each other at the points where data voltages are P1 and P2, graph B represents a more driving current (Id) value than graph A in the data voltage range of less than P1 or more than P2, and graph A represents a more driving current (Id) value than graph B in the data voltage range of P1 to P2. Further, the first transistor T1 may be driven between the first driving current value Id1 and the second driving current value Id2.

The driving range DB of the first transistor T1 in graph B is larger than the driving range DA of the first transistor T1 in graph A. In other words, between the first driving current value Id1 and the second driving current value Id2, the absolute value of the slope in graph B is smaller than the absolute value of the slope in graph A, and the range of the data voltage Vdata capable of controlling the driving current Id capable of driving the light emitting element LE (refer to FIG. 3) increases. Accordingly, the driving current Id may be more easily adjusted, and further, the luminance of one pixel PX (refer to FIG. 3) may be more easily adjusted.

Further, between P1 and P2, even when the same data voltage Vdata is applied, in the first transistor T1 of graph B, a large driving current Id flows, as compared with the first transistor T1 of graph A. Accordingly, when the same data voltage Vdata is applied, the driving current Id may be improved in the case (graph B) where the driving range increases, and further, the luminance of one pixel PX (refer to FIG. 3) may be increased, light efficiency of the display device 1 (refer to FIG. 1) may be improved, and afterimages may be improved.

Further, referring to FIG. 11, in the graph of FIG. 11, the X-axis indicates whether the first charge trap layer AI1 and the second charge trap layer AI2 are disposed, and the Y axis indicates a change ADR1 in driving range of the first transistor T1.

In FIG. 11, N1 indicates a case where an amorphous silicon layer, not the first charge trap layer AI1, is disposed at the position of the first charge trap layer AI1, and an inorganic layer, not the second charge trap layer AI2, is disposed at the position of the second charge trap layer AI2.

N2 indicates a case where the first charge trap layer AI1 is disposed, and an inorganic layer, not the second charge trap layer AI2, is disposed at the position of the second charge trap layer AI2.

N3 indicates a case where the first charge trap layer AI1 is not disposed, and an inorganic layer, not the second charge trap layer AI2, is disposed at the position of the second charge trap layer AI2.

N4 indicates a case where the first charge trap layer AI1 is not disposed, and the second charge trap layer AI2 is disposed.

In N1, N2, and N3, the channel region of the active layer of the first transistor T1 is doped with any one of boron (B) and fluorine (F), and in N4, the channel region of the active layer of the first transistor T1 is not doped.

In N1, N2, and N3, the inorganic layer disposed at the position of the second charge trap layer AI2 includes silicon oxide ($SiO_x$), but the ratio of N—H bonds in the inorganic layer may be less than 0.7 at %. For example, the ratio of N—H bonds in the inorganic layer may be 0.3 at %.

In N1, the change ADR1 in driving range of the first transistor T1 has an average value of 0.14. In N2, the change ADR1 in driving range of the first transistor T1 has an average value of 0.338. In N3, the change ADR1 in driving range of the first transistor T1 has an average value of 0.014. In N4, the change ADR1 in driving range of the first transistor T1 has an average value of 0.056.

Comparing N1, N2, and N3, in the case (N2) where the first charge trap layer AI1 is disposed, the change ADR1 in driving range of the first transistor T1 is larger than that in the case (N1) where an amorphous silicon layer is disposed at the position of the first charge trap layer AI1 and in the case (N3) where the first charge trap layer AI1 is not disposed.

Comparing N3 and N4, in the case (N4) where the second charge trap layer AI2 is disposed, the change ADR1 in driving range of the first transistor T1 is larger than that in the case (N3) where an amorphous silicon layer is disposed at the position of the first charge trap layer AI1 and in the case (N3) where an inorganic layer, not the second charge trap layer AI2, is disposed at the position of the second charge trap layer AI2.

Accordingly, when the first charge trap layer AI1 and the second charge trap layer AI2 are disposed, the driving range of the first transistor T1 may be further increased. Accordingly, the driving current may be more easily adjusted, and the luminance of one pixel (PX, refer to FIG. 3) may be more easily adjusted. Moreover, even when the same data voltage Vdata is applied, one pixel PX (refer to FIG. 3) may emit light with higher luminance, so that an afterimage defect may be improved.

In addition, even when doping of the channel region of the active layer of each of the transistors T1 to T7 is omitted, in the case where the second charge trap layer AI2 is disposed, the driving range of the first transistor T1 may be further increased. Accordingly, doping of the channel region of the active layer of each of the transistors T1 to T7 may be omitted, so that processes may be simplified, and process costs may be reduced.

Figure 12:
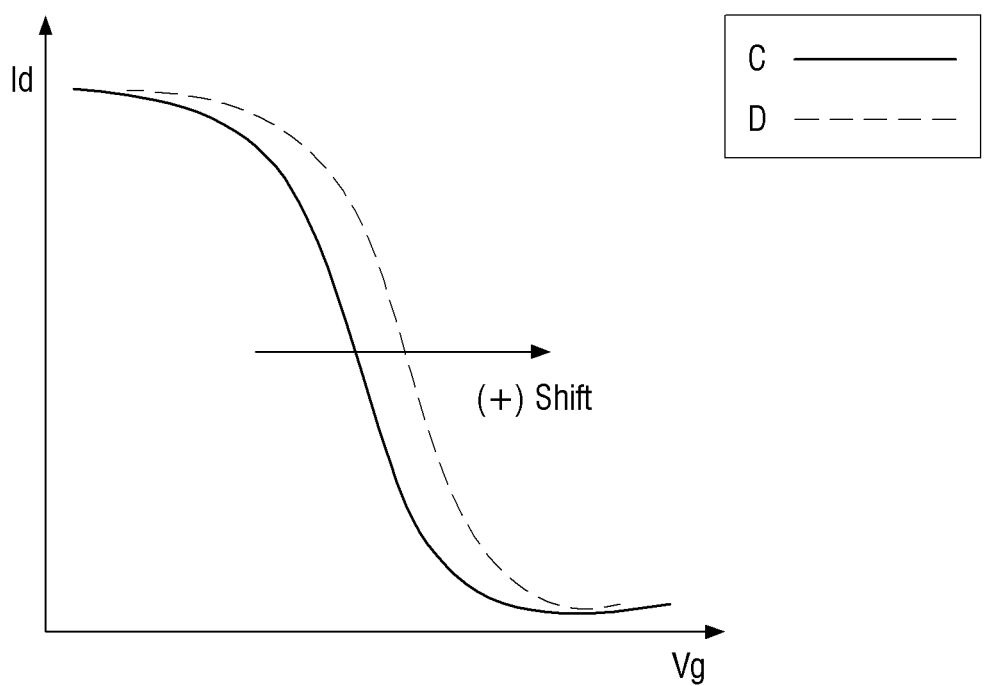
FIG. 12 is a graph of a driving current with respect to a gate voltage of a third transistor according to an embodiment.
Figure 13:
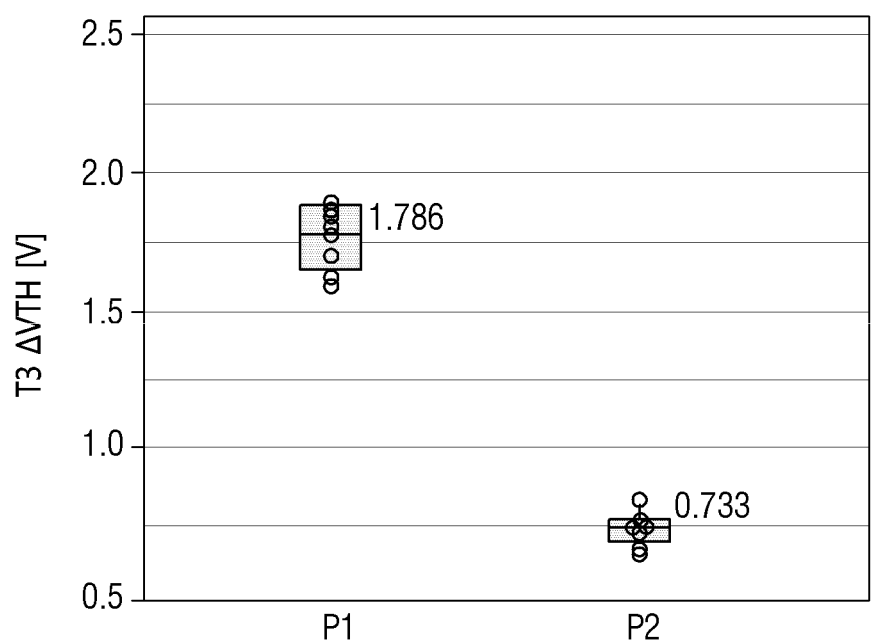
FIG. 13 is a graph illustrating a change ΔVth in a threshold voltage of a third transistor according to whether a first charge trap layer and a second charge trap layer are arranged.

Subsequently, FIGS. 12 and 13 are referred to in order to explain a change in element characteristics of a third transistor T3 according to an embodiment.

FIG. 12 is a graph of a driving current with respect to a gate voltage of a third transistor according to an embodiment. FIG. 13 is a graph illustrating a change ΔVth in threshold voltage of a third transistor according to whether a first charge trap layer and a second charge trap layer are arranged.

Referring to FIG. 12, graph C represents a driving current Id with respect to a gate voltage Vg of the third transistor T3. Graph D represents a driving current Id with respect to the gate voltage Vg of the third transistor T3 when the change ΔVth in threshold voltage of the third transistor T3 increases.

Graph D is shifted in a positive direction ((+) shifted) than graph C. In other words, when the change ΔVth in threshold voltage of the third transistor T3 increases, the graph of the driving current Id with respect to the gate voltage Vg of the third transistor T3 is shifted in the positive direction ((+) shifted). When the graph of the driving current Id with respect to the gate voltage Vg of the third transistor T3 is shifted in the positive direction ((+) shifted), kickback of the third transistor T3 may increase. Accordingly, the luminance of one pixel PX (refer to FIG. 3) may decrease, and further, the light efficiency of the display device 1 (refer to FIG. 1) may decrease.

Referring to FIG. 13, in the graph of FIG. 13, the X-axis indicates whether the first charge trap layer AI1 and the second charge trap layer AI2 are disposed, and the Y-axis indicates a change ΔVth in threshold voltage of the third transistor T3.

In FIG. 13, P1 indicates a case where the first charge trap layer AI1 and the second charge trap layer AI2 are disposed, and P2 indicates a case where the first charge trap layer AI1 is not disposed and the second charge trap layer AI2 is disposed.

In P1, the change ΔVth in threshold voltage of the third transistor T3 has an average value of 1.786. In P2, the change ΔVth in threshold voltage of the third transistor T3 has an average value of 0.733. That is, in the case (P1) where the first charge trap layer AI1 is disposed, the change ΔVth in threshold voltage of the third transistor T3 is larger than that in the case (P2) where the first charge trap layer AI1 is not disposed. In other words, in the case where the first charge trap layer AI1 is disposed, the graph of the driving current Id with respect to the gate voltage Vg of the third transistor T3 is shifted in the positive direction.

However, since the first charge trap layer AI1 includes the first opening OP1, the first charge trap layer AI1 may not be disposed under the active layer of the third transistor T3. Accordingly, it is possible to suppress or prevent the graph of the driving current Id with respect to the gate voltage Vg of the third transistor T3 from being shifted, thus suppressing or preventing an increase of kickback of the third transistor T3 and suppressing or preventing an increase of luminance of one pixel PX (refer to FIG. 3). Furthermore, it is possible to suppress or prevent a decrease in light efficiency of the display device 1 (refer to FIG. 1), and to improve an afterimage.

That is, since the first charge trap layer AI1 is disposed under the first transistor T1 and not selectively disposed under the third transistor T3, the element characteristics of the first transistor T1 may be improved, and the deterioration in element characteristics of the third transistor T3 may be prevented.

Hereinafter, other embodiments will be described. In the following embodiments, for the same configurations as those previously described, redundant descriptions will be omitted or simplified, and differences will be mainly described.

Figure 14:
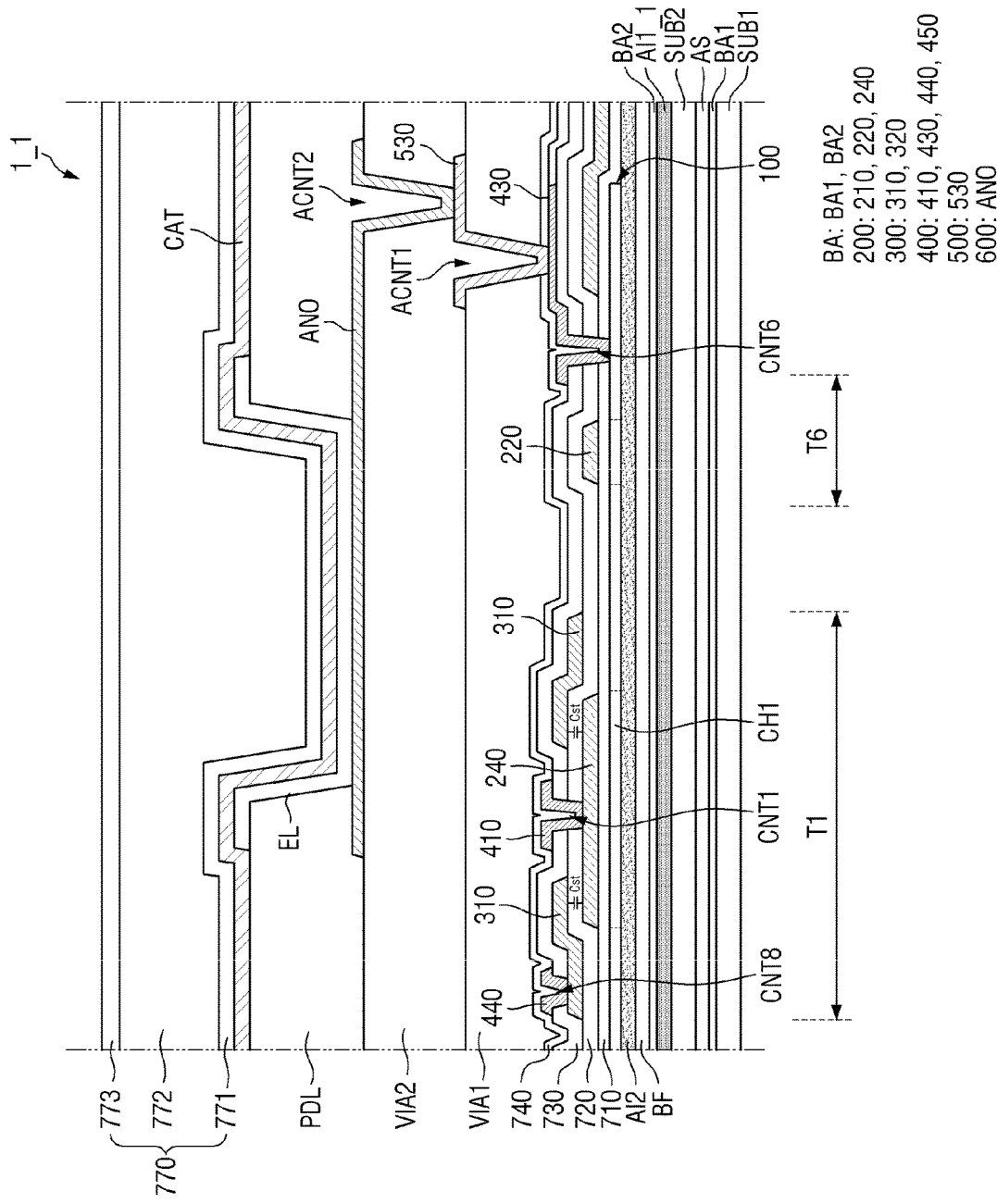
FIG. 14 is a cross-sectional view of a display device according to an embodiment.

FIG. 14 is a cross-sectional view of a display panel according to an embodiment.

Referring to FIG. 14, the present embodiment is different from the embodiment of FIG. 7 in that a first charge trap layer AI1_1 of a display device 1_1 according to this embodiment may be disposed between the second substrate SUB2 and the second barrier layer BA2.

Specifically, the first charge trap layer AI1_1 of the display device 1_1 according to this embodiment may be disposed between the second substrate SUB2 and the second barrier layer BA2. In this case, the display device 1_1 may further include a lower semiconductor layer AS. The lower semiconductor layer AS may be disposed between the first substrate SUB1 and the second substrate SUB2. The lower semiconductor layer AS may be disposed on the first barrier layer BA1, and may be disposed between the first barrier layer BA1 and the second substrate SUB2.

The lower semiconductor layer AS may include amorphous silicon. However, the lower semiconductor layer AS may include at least one of polycrystalline silicon and oxide silicon. The lower semiconductor layer AS serves to more firmly attach components stacked on and under the lower semiconductor layer AS to each other. For example, since the lower semiconductor layer AS is disposed, the first substrate SUB1 and second substrate SUB2 disposed on and under the lower semiconductor layer AS may be more firmly attached to each other, and reliability of the display device 1_1 may be improved.

Even in this case, since the first charge trap layer AI1_1 and the second charge trap layer AI2 are disposed, the element characteristics of the first transistor T1 may be improved, luminance may be improved, and afterimages may be improved. In addition, since the distance between the first charge trap layer AI1_1 and the semiconductor layer 100 decreases, the element characteristics of the first transistor T1 may be further improved. In addition, since the lower semiconductor layer AS is further disposed between the first substrate SUB1 and the second substrate SUB2, the reliability of the display device 1_1 may be improved.

Figure 15:
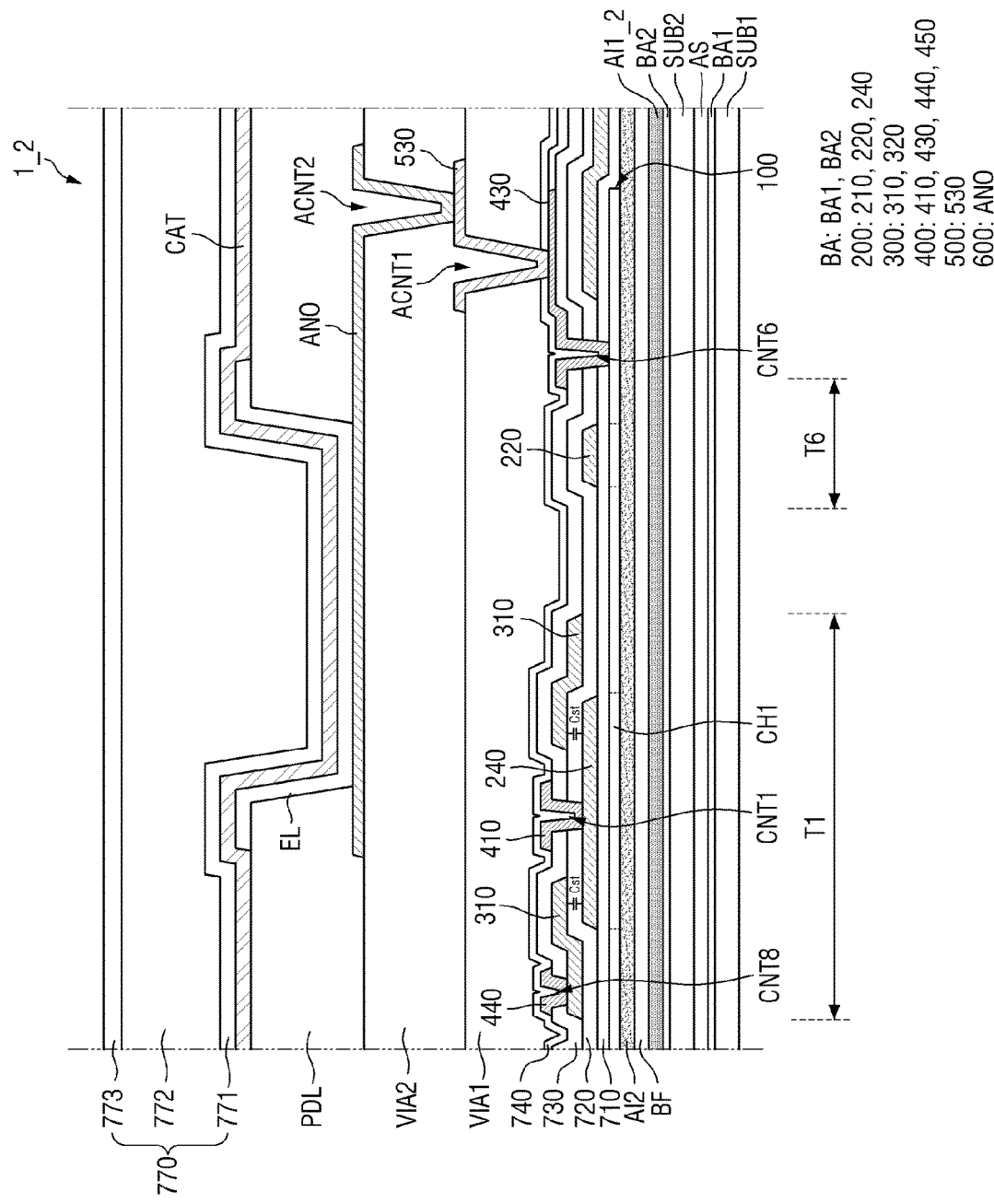
FIG. 15 is a cross-sectional view of a display device according to an embodiment.

FIG. 15 is a cross-sectional view of a display panel according to an embodiment.

Referring to FIG. 15, the present embodiment is different from the embodiment of FIG. 14 in that a first charge trap layer AI1_2 of a display device 1_2 according to this embodiment may be disposed between the second barrier layer BA2 and the buffer layer BF. Even in this case, since the first charge trap layer AI1_2 and the second charge trap layer AI2 are disposed, the element characteristics of the first transistor T1 may be improved, luminance may be improved, and afterimages may be improved. In addition, since the distance between the first charge trap layer AI1_2 and the semiconductor layer 100 decreases, the element characteristics of the first transistor T1 may be further improved. In addition, since the lower semiconductor layer AS is further disposed between the first substrate SUB1 and the second substrate SUB2, the reliability of the display device 1_2 may be improved.

In concluding the detailed description, those skilled in the art will appreciate that many variations and modifications can be made to the embodiments without substantially departing from the principles of the present disclosure. Therefore, the disclosed embodiments of the inventive concept are used in a generic and descriptive sense only and not for purposes of limitation.

What is claimed is:

1. A display device, comprising:
a first substrate;
a first charge trap layer disposed on the first substrate and including silicon nitride;
a semiconductor layer disposed on the first charge trap layer and including a first active layer of a first transistor and a second active layer of a second transistor; and
an organic light emitting element electrically connected to the first transistor,
wherein a ratio of a content of a Si element to a content of an N element in the first charge trap layer is in a range of 1.6 to 2.5,
wherein the content of the Si element in the first charge trap layer is in a range of 60 at % to 70 at % and the content of the N element in the first charge trap layer is in a range of 25 at % to 35 at %.

2. The display device of claim 1,
wherein the content of the Si element and the content of the N element are analyzed through energy dispersion X-ray spectrometry (EDS).

3. A display device, comprising:
a first substrate;
a first charge trap layer disposed on the first substrate and including silicon nitride;
a semiconductor layer disposed on the first charge trap layer and including a first active layer of a first transistor and a second active layer of a second transistor; and
an organic light emitting element electrically connected to the first transistor,
wherein a ratio of a content of a Si element to a content of an N element in the first charge trap layer is in a range of 1.6 to 2.5,
wherein a ratio of Si-H bonds in the first charge trap layer is in a range of 8 at % to 15 at %.

4. The display device of claim 3,
wherein a ratio of the Si-H bonds to N-H bonds in the first charge trap layer is in a range of 8 to 15.

5. The display device of claim 4,
wherein a ratio of the N-H bonds in the first charge trap layer is in a range of 0.1 at % to 15 at %.

6. The display device of claim 5,
wherein the first charge trap layer is formed under an ammonia-free (NH3-free) condition.

7. A display device, comprising:
a first substrate;
a first charge trap layer disposed on the first substrate and including silicon nitride;
a semiconductor layer disposed on the first charge trap layer and including a first active layer of a first transistor and a second active layer of a second transistor;
an organic light emitting element electrically connected to the first transistor,
a second charge trap layer disposed between the first charge trap layer and the semiconductor layer and including silicon oxide, and
wherein a ratio of a content of a Si element to a content of an N element in the first charge trap layer is in a range of 1.6 to 2.5,
wherein a ratio of N-H bonds in the second charge trap layer is in a range of 0.7 at % to 1.5 at %.

8. The display device of claim 7, further comprising:
a second substrate disposed on the first substrate,
wherein the second substrate is disposed between the first substrate and the first charge trap layer.

9. The display device of claim 8, further comprising:
a lower semiconductor layer disposed between the first substrate and the second substrate.

10. A display device, comprising:
a first substrate;
a first charge trap layer disposed on the first substrate and including silicon nitride;

a semiconductor layer disposed on the first charge trap layer and including a first active layer of a first transistor and a second active layer of a second transistor;
an organic light emitting element electrically connected to the first transistor,
a second substrate disposed on the first substrate, and
wherein a ratio of a content of a Si element to a content of an N element in the first charge trap layer is in a range of 1.6 to 2.5,
wherein the first charge trap layer is disposed between the first substrate and the second substrate.

11. A display device, comprising:
a first substrate;
a first charge trap layer disposed on the first substrate and including silicon nitride;
a semiconductor layer disposed on the first charge trap layer and including a first active layer of a first transistor and a second active layer of a second transistor; and
an organic light emitting element electrically connected to the first transistor,
wherein a ratio of a content of a Si element to a content of an N element in the first charge trap layer is in a range of 1.6 to 2.5,
wherein the first charge trap layer overlaps the first active layer, and does not overlap the second active layer.

12. The display device of claim 11,
wherein the first charge trap layer includes an opening penetrating in a thickness direction, and the opening overlaps at least a channel region of the second transistor.

13. A display device, comprising:
a first substrate;
a first charge trap layer disposed on the first substrate and including silicon nitride;
a semiconductor layer disposed on the first charge trap layer and including a first active layer of a first transistor and a second active layer of a second transistor;
an organic light emitting element electrically connected to the first transistor,
wherein a ratio of a content of a Si element to a content of an N element in the first charge trap layer is in a range of 1.6 to 2.5,
wherein the first transistor controls a driving current flowing from a first electrode to a second electrode according to a voltage applied to a gate electrode of the first transistor,
the second transistor is disposed between the gate electrode of the first transistor and the second electrode of the first transistor, and
the organic light emitting element is electrically connected to the second electrode of the first transistor, and emits light according to the driving current.

14. A display device, comprising:
a first substrate;
a first charge trap layer disposed on the first substrate and including silicon nitride;
a second substrate disposed on the first substrate with the first charge trap layer between the first substrate and the second substrate;
a second charge trap layer disposed on the second substrate and including silicon oxide;
a semiconductor layer disposed on the second charge trap layer and including a first active layer of a first transistor and a second active layer of a second transistor; and
an organic light emitting element electrically connected to the first transistor,
wherein a ratio of N-H bonds in the second charge trap layer is in a range of 0.7 at % to 1.5 at %.

15. The display device of claim 14,
wherein the first charge trap layer overlaps the first active layer, and does not overlap the second active layer.

16. The display device of claim 14,
wherein a ratio of a content of a Si element to a content of an N element in the first charge trap layer is in a range of 1.6 to 2.5.

17. A display device, comprising:
a first substrate;
a first charge trap layer disposed on the first substrate and including silicon nitride;
a semiconductor layer disposed on the first charge trap layer and including a first active layer of a first transistor and a second active layer of a second transistor; and
an organic light emitting element electrically connected to the first transistor,
wherein a content of a Si element in the first charge trap layer is in a range of 60 at % to 70 at %, and a content of an N element in the first charge trap layer is in a range of 25 at % to 35 at %.

18. The display device of claim 17, further comprising:
a second charge trap layer disposed on the first charge trap layer and including silicon oxide,
wherein a ratio of N-H bonds in the second charge trap layer is in a range of 0.7 at % to 1.5 at %.

19. The display device of claim 17,
wherein the first charge trap layer overlaps the first active layer, and does not overlap the second active layer.

* * * * *